(12) United States Patent
Masai et al.

(10) Patent No.: US 7,900,350 B2
(45) Date of Patent: Mar. 8, 2011

(54) METHOD OF MANUFACTURING A WIRING BOARD

(75) Inventors: Taku Masai, Shibuya-ku (JP); Koji Sano, Nara (JP)

(73) Assignee: OMRON Corporation, Kyoto (JP)

( * ) Notice: Subject to any disclaimer, the term of this patent is extended or adjusted under 35 U.S.C. 154(b) by 1127 days.

(21) Appl. No.: 11/373,521

(22) Filed: Mar. 10, 2006

(65) Prior Publication Data

US 2006/0209520 A1    Sep. 21, 2006

(30) Foreign Application Priority Data

Mar. 14, 2005    (JP) .................................. 2005-071692

(51) Int. Cl.
*H05K 3/02*    (2006.01)
(52) U.S. Cl. ............... 29/847; 29/830; 29/832; 257/775; 438/118
(58) Field of Classification Search .................. 174/255, 174/261; 257/773, 775; 361/777; 438/118, 438/123, 125; 29/830, 832, 834, 835, 846, 847

See application file for complete search history.

(56) References Cited

U.S. PATENT DOCUMENTS 6,060,342 A * 5/2000 Montauti et al. ............... 438/125
6,495,768 B1 * 12/2002 Cho ................................ 29/847

FOREIGN PATENT DOCUMENTS

| JP | 2003-197796 A | 7/2003 |
| JP | 2003197796 A * | 7/2003 |

OTHER PUBLICATIONS

Office Action for Chinese Application No. 200610064816.6 dated Jul. 31, 2009 and English translation thereof, 7 pages.

* cited by examiner

*Primary Examiner* — Donghai D. Nguyen
(74) *Attorney, Agent, or Firm* — Osha Liang LLP

(57) ABSTRACT

A circuit element comprises a wiring board; the wiring board comprises a substrate and a wiring formed on the substrate, and a lid joined on the substrate containing a part of the wiring with a binder and making a sealed space above the substrate, wherein if a spot of the wiring joined with the lid by a binder is a spot of junction, a flank of both flanks of the wiring comprise bends in the spot of junction.

4 Claims, 26 Drawing Sheets

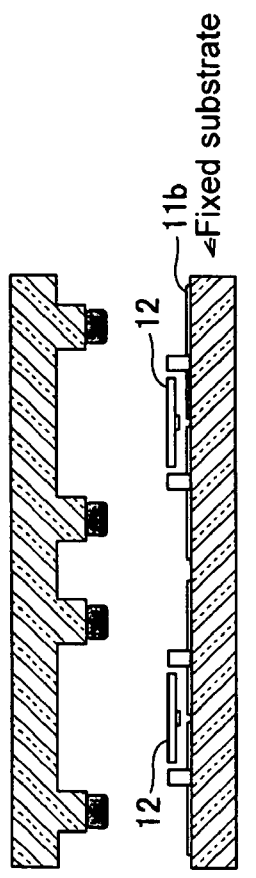
Fig. 4A
Fig. 4B
Fig. 4C
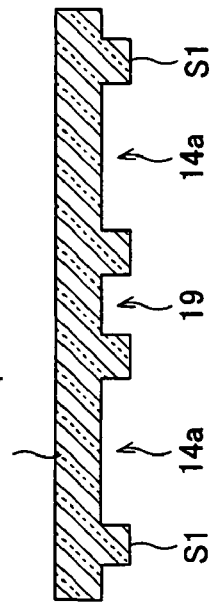
Fig. 4D
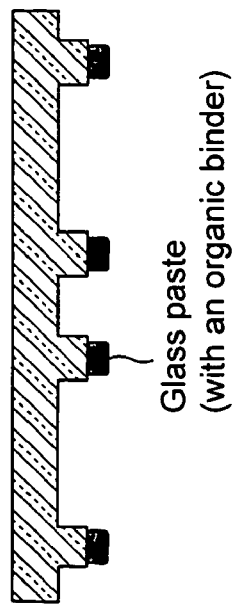
Fig. 4E
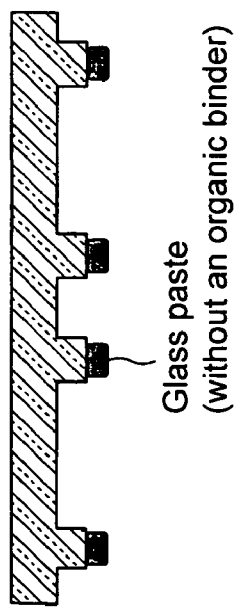
Fig. 4F Area A

METHOD OF MANUFACTURING A WIRING BOARD

BACKGROUND OF THE INVENTION

1. Field of the Invention

The present invention relates to a method of manufacturing a wiring board, a photomask, a wiring board, a circuit element and a communications device.

2. Description of the Related Art

A structure having the interior hermetically sealed by using sealed glass has been conventionally known. Among said structures, large ones include a cathode ray tube or a plasma display panel, for instance, and small ones include an SAW device or a crystal device.

In addition, in recent years, high-frequency signals in GHz band for carrying out high-speed and large volume communications have come into use. For this reason, need for a high frequency device (hereinafter referred to as an MEMS device) by MEMS (Micro Electro Mechanical System) technique has increased. For instance, MEMS devices include such devices as a switch, a relay (switching element), a filter, a resonator, a phase shifter, etc. In such the MEMS devices, as it is necessary to protect a mechanism (an operating unit or a contact unit, etc.) of the device against corrosion, dust, etc., and to improve responsiveness by depressurizing an internal space containing the mechanism, the space including the mechanism is sealed by said sealed glass.

A structure for transmitting a high frequency signal includes a structure of microstrip line type or coplanar type. In particular, in the structure of coplanar type, as downsizing is easy to plan and electrical bonding strength between wires is weak, the coplanar type structure is often used in MEMS devices.

Now we describe an MEMS device having the coplanar type structure (hereinafter referred to as a MEMS switching element) that functions as a switching element (relay). As shown in FIG. 22, a MEMS switching element comprises a wiring board 91, a movable electrode 92, fritted glass (sealed glass) 93, and a cap 94. In addition, the wiring board 91 comprises a glass substrate 91a, signal lines 91b, 91c, a fixed electrode (GND) 91d, fixed contacts 91e, 91f, and bonding pads 91g . . . In addition, the signal lines 91b, 91c, the fixed electrode 91d, the fixed contacts 91e, 91f and the bonding pads 91g . . . are formed on the glass substrate 91a. Furthermore, the movable electrode 92 comprises a movable contact 92a. In addition, the movable electrode 92 is biased toward the cap 94 by a spring (not shown).

The MEMS switching element 90 also has a configuration that can apply voltage between the fixed electrode 91d and the movable electrode 92 through the bonding pads 91g . . . Then, electrostatic force generated by the voltage attracts the movable electrode 92 to the side of the wiring board 91, thereby bringing the movable contact 92a into contact with the fixed contacts 91e, 91f. With this, the signal line 91b is electrically connected with the signal line 91c. On the one hand, stopping the application of said voltage releases the connection between said signal line 91b and the signal line 91c (i.e., they are isolated). Thus, switching ON/OFF of the switch is implemented by applying or not applying said voltage.

In the MEMS switching element 90, the wiring board 91 is bonded with the cap 94 by heating and melting the fritted glass 93 that has been bonded to the cap 94 in advance, and applying predetermined pressure between the cap 94 and the wiring board 91. In addition, the surface of the wiring board 91 is odd-shaped (i.e., a shape having steps) by the signal lines 91b, 91c, and the bonding pads 91d, . . . , as shown in FIG. 23.

Thus, in the area where the fritted glass 93 contacts the wiring board 91 (hereinafter referred to as a junction area (See FIG. 22.)), as shown in FIG. 24, the fritted glass 93 enters a gap G1 between the signal line 91b and the bonding pad 91g and a gap G2 between the bonding pads 91g. Then, entry of the fritted glass 93 into said gaps (G1, G2) results in hermetic sealing of a space containing the movable electrode 92.

Now we describe a method of manufacturing a MEMS switching element 90.

First, a metal thin film for the signal lines 91b, 91c, the fixed electrode 91d, and the bonding pads 91g . . . is formed on glass wafer. Then, a pattern by a resist (hereinafter referred to as a resist pattern) is generated on the metal thin film, by using a photomask on which a predetermined pattern is formed. Furthermore, etching is performed with this resist pattern as a mask, to selectively remove the metal thin film. Then, the resist is removed. Further, an insulation protective film is formed on the fixed electrode 91d. Thus, a fixed substrate comprised of a plurality of wiring boards 91 has been formed.

Then, after the respective movable electrodes 92 are generated at predetermined positions on the respective wiring boards 91, under reduced pressure, a substrate formed of a plurality of contiguous caps 94 (hereinafter referred to as a glass cap substrate) is joined to the fixed substrate so as to cover the respective movable electrodes 92.

Then, the fixed substrate to which the glass cap substrate is joined is cut (i.e., subjected to dicing) into discrete chips (MEMS switching elements), together with the glass cap substrate. Thus, a plurality of MEMS switching elements 90 are produced at one time, by using so-called wafer level packaging technology (technology of packaging chips prior to dividing them into individual chips). In addition, as the above etching, in general, wet etching is used.

However, use of the above conventional manufacturing method leads to the problem that among MEMS switching elements 90 that have been simultaneously manufactured, a space containing a movable electrode 92 is not sealed completely in some MEMS switching elements 90. In the following, we describe reasons for the problem with reference to FIG. 25 and FIG. 26.

After the above resist pattern is generated as shown in FIG. 25A, wet etching takes place as shown in FIG. 25B. Furthermore, as the etching progresses, the surface of glass wafer is exposed as shown in FIG. 25C.

Now, ideally, as shown in FIG. 25D, the etching may be terminated with all the MEMS switching elements 90 free from side etching. However, as etching rate fluctuates on the surface of glass wafer, as shown in FIG. 25E, side etching occurs in the area where the etching rate is faster than the normal rate.

In the area with a higher etching rate, in particular, an end of the resist is inclined toward (i.e., sags to) the side of the glass wafer as shown in FIG. 25F (i.e., the side of the glass substrate 91a). Hence, supply to the resist of etchant closer to the glass wafer (for instance, in the case that the above metal thin film is gold (Au), potassium iodide solution (KI) etc.) exceeds that of etchant closer to the resist. Thus, as shown in FIG. 25G, a shape of the metal thin film will be so-called inverted-mesa structure. In other words, area of a contact surface with the glass wafer, with respect to the metal thin film, will be smaller than that of a surface opposed to the contact surface.

Consequently, as shown in FIG. 26, the fritted glass 93 cannot completely flow into a gap G3 that resulted from the inverted-mesa structure. This generates the MEMS switching elements 90 in which the space containing the movable electrode 92 (predetermined space) is not perfectly sealed.

In addition, a similar problem is generated in MEMS devices other than MEMS switching elements 90.

SUMMARY OF THE INVENTION

Embodiments of the present invention provide a method of manufacturing a wiring board, a wiring board, a circuit element, and a communications device, which can reliably seal a space above a surface area containing at least a part of wiring.

In accordance with one aspect of the present invention, a wiring board having wiring formed on a substrate, wherein a space above a surface area containing at least a part of said wiring is subject to sealing by a lid and a binder for joining said lid, said substrate, and said wiring, and a method of manufacturing the wiring board, comprising the steps of: a first step of forming a metal thin film for wiring on the substrate, a second step of generating a resist pattern on said metal thin film by using a photomask on which a wiring pattern is formed: wherein if it is assumed that a spot of the wiring to be joined by said binder is a junction spot, the flank of said wiring pattern bends in the area corresponding to said junction; and a third step of selectively removing the metal thin film by wet etching, with said resist pattern as a mask, and forming said wiring.

An embodiment of the present invention, said both flanks bend respectively in a plurality of spots.

An embodiment of the present invention, said bends take the form of U shape; wherein the following relationship is satisfied, $$d>L/4$$

where length of the side of said U shape in the direction along said flank is L, and that of the side of said U shape in the direction perpendicular to said flank is d.

An embodiment of the present invention, said wiring are comprised of a signal line and an earthing conductor; and said signal line and said earthing conductor are spaced at a regular interval; the following relationship is satisfied, $$(D-18W0)/20<d<(D-3W0)/8$$

where said interval is W0 and width of said signal line is D.

In accordance with one aspect of the present invention, a wiring board having wiring formed on a substrate, wherein a space above a surface area containing at least a part of said wiring is subject to sealing by a lid; and a binder for joining said lid, said substrate and said wiring; a photomask for use in manufacture of the wiring board: wherein a wiring pattern is formed; if it is assumed a spot of the wiring to be joined by said binder is a junction spot, the flank of said wiring pattern bends in the area corresponding to said junction spot.

In accordance with one aspect of the present invention, a wiring board having wiring formed on a substrate wherein a space above a surface area containing at least a part of said wiring is subject to sealing by a lid; and a binder for joining said lid, said substrate and said wiring; if it is assumed that a spot of the wiring to be joined by said binder is a spot f junction, any one flank of both flanks of said wiring comprises a plurality of bends in said spot of junction.

In accordance with one aspect of the present invention, a wiring board having wiring formed on a substrate wherein a space above a surface area containing at least a part of said wiring is subject to sealing by a lid; and a binder for joining the lid, said substrate and said wiring; if it is assumed that a spot of the wiring to be joined by said binder is a spot of junction, both flanks of said wiring comprise bends in said spot of junction.

An embodiment of the present invention, each of the both flanks of said wiring comprises a plurality of bends.

An embodiment of the present invention, said bends take the form of U shape); wherein the following relationship is satisfied, $$d>L/4$$

where length of the side of said U shape in the direction along said flank is L, and that of the side of said U shape in the direction perpendicular to said flank is d.

An embodiment of the present invention, said wirings are comprised of a signal line and an earthing conductor; and said signal line and said earthing conductor are spaced at a regular interval; the following relationship is satisfied, $$(D-18W0)/20<d<(D-3W0)/8$$

where said interval is W0 and width of said signal line is D.

In accordance with one aspect of the present invention, a circuit element comprises a lid; a binder; and a wiring board having wiring formed on a substrate; a space above a surface area containing at least a part of said wiring is subject to sealing by the lid; and the binder for joining the lid, the substrate, and the wiring; if it is assumed that a spot of the wiring to be joined by said binder is a spot of junction, any one flank of both flanks of said wiring comprises a plurality of bends in said spot of junction; wherein the space above said surface area is sealed by said lid and said binder.

An embodiment of the present invention, said wiring board has 2 signal lines; when voltage having a predetermined potential difference is applied to a reference potential, a connection for connecting said 2 signal lines each other is provided in a space above said surface area.

An embodiment of the present invention, said wiring board comprises a first signal line; a second signal line; and a third signal line; wherein among them, the first and second signal lines are used as signal lines on the input side and output side; in a space above said surface area is provided a selection unit for selectively connecting said third signal line with any one of said first and second signal lines.

In according with one aspect of the present invention, a communications device comprises an antenna; an internal processing circuit; a circuit element connected between said antenna and said internal processing circuit; said circuit element comprises a lid; a binder; and a wiring board having wiring formed on a substrate; a space above a surface area containing at least a part of said wiring is subject to sealing by the lid, and the binder for joining the lid, said substrate and said wiring board; if it is assumed that a spot of the wiring to be joined by said binder is a spot of junction, any one flank of both flanks of said wiring comprises a plurality of bends in said spot of junctions wherein the space above said surface area is sealed by said lid and said binder.

BRIEF DESCRIPTION OF THE DRAWINGS

FIG. 4A to FIG. 4F are cross-sectional views of one example of a manufacturing process of said MEMS switching element.

DETAILED DESCRIPTION OF THE EMBODIMENTS

Figure 21:
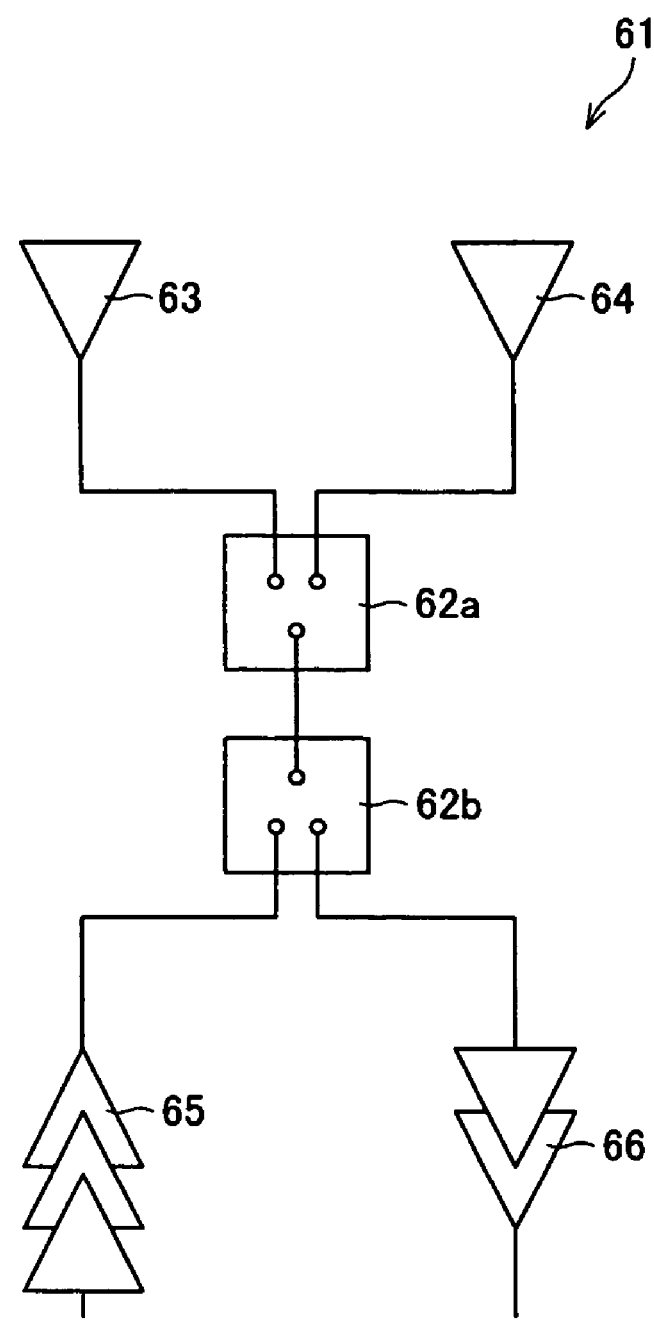
FIG. 21 shows a circuit diagram illustrating configuration of relevant parts of a handheld terminal comprising select type switches manufactured by a method of manufacturing according to the present embodiment.
Figure 22:
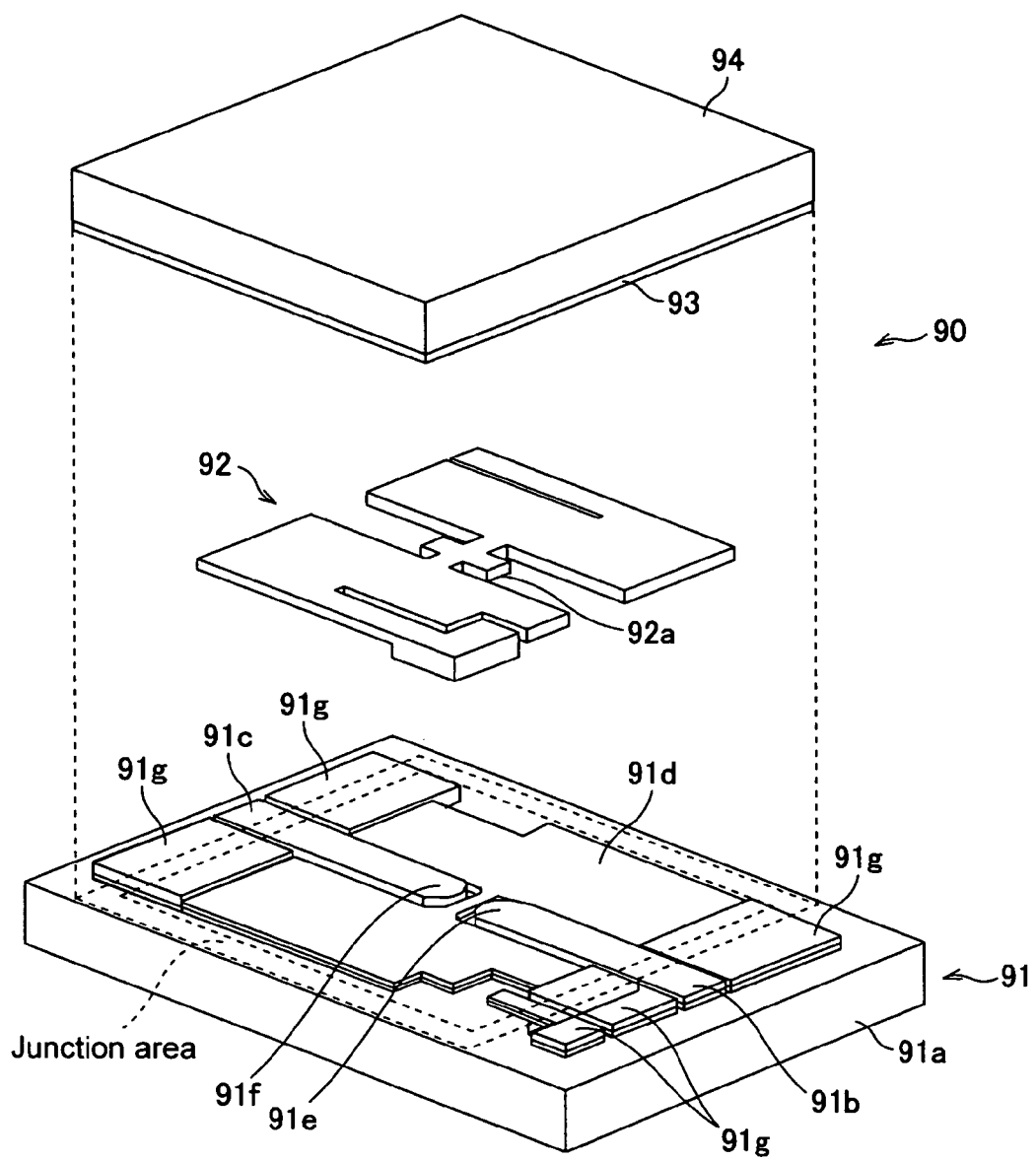
FIG. 22 is an exploded view of a conventional MEMS switching element.
Figure 23:
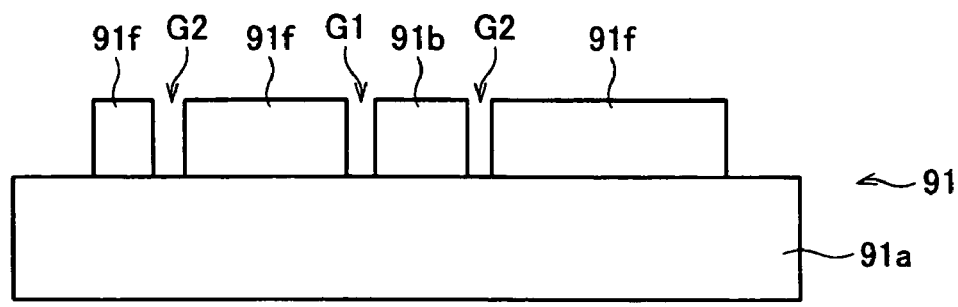
FIG. 23 is a cross section of a wiring board of said conventional MEMS switching element, showing a section perpendicular to the direction of extended signal line.
Figure 24:
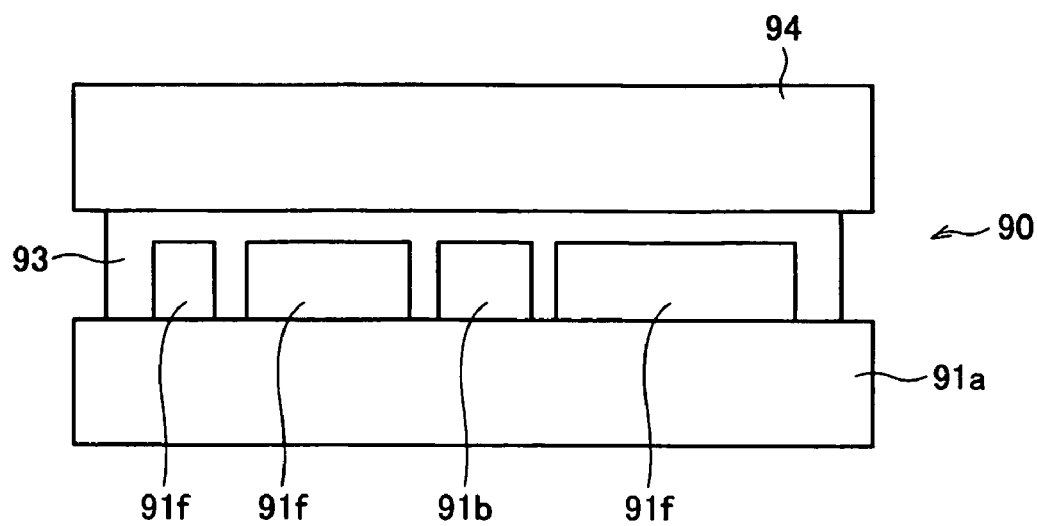
FIG. 24 is a cross-sectional view of said conventional MEMS switching element, showing a section perpendicular to the direction of extended signal line.
Figure 25D:
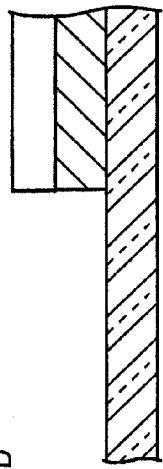
FIG. 25A to FIG. 25G are cross-sectional views of one example of a manufacturing process of the MEMS switching element of FIG. 22.
Figure 25E:
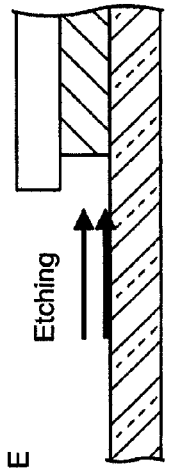
Figure 25F:
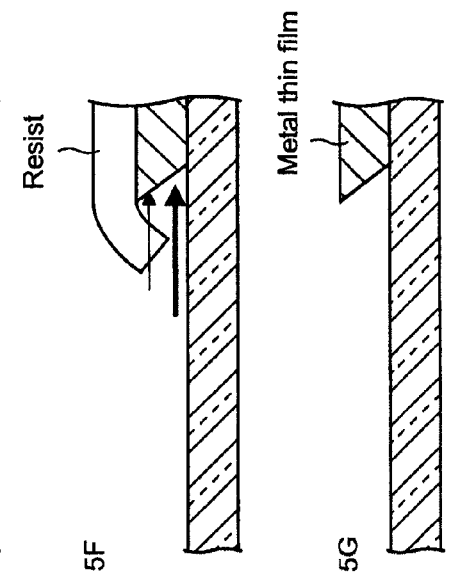
Figure 25G:
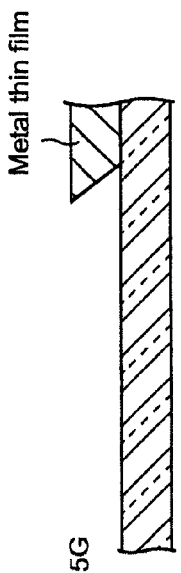
Figure 25A:
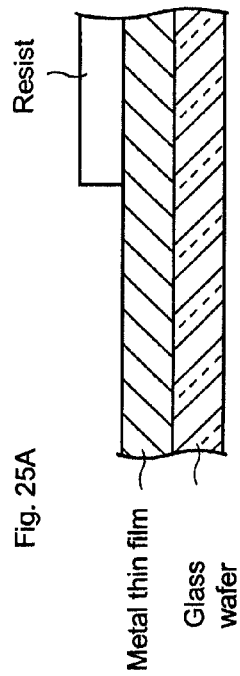
Figure 25B:
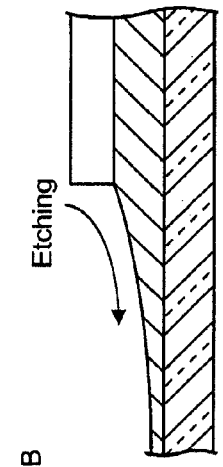
Figure 25C:
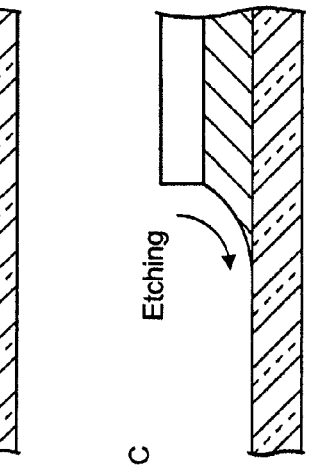
Figure 26:
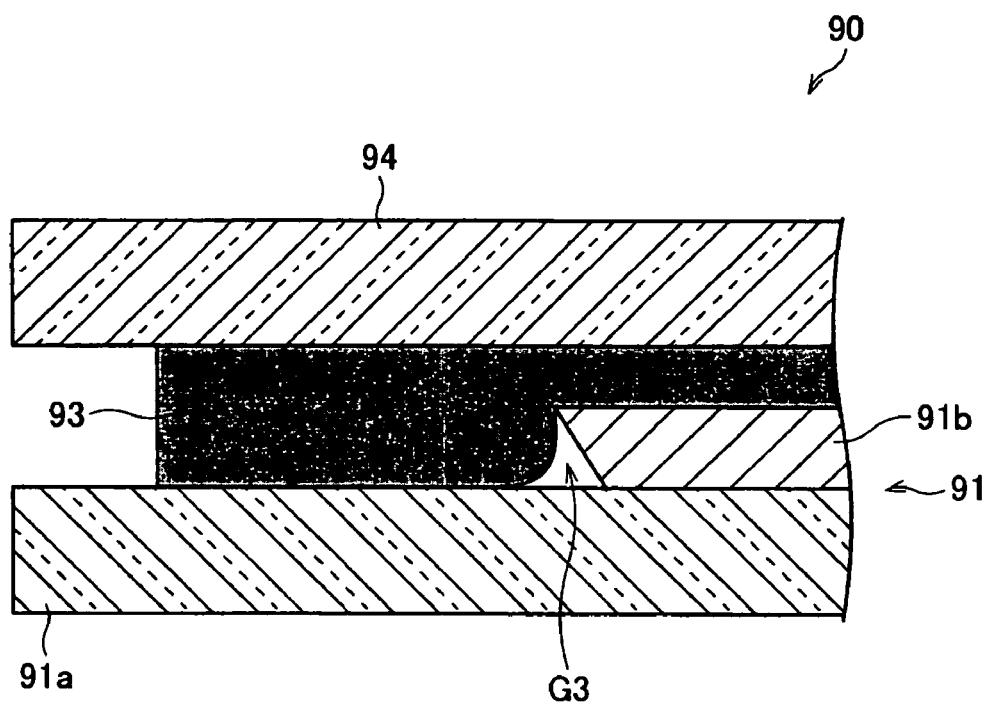
FIG. 26 is a cross-sectional view of a conventional other MEMS switching element, showing a section perpendicular to the direction of extended signal line.

In the following, we describe one embodiment of the present invention with reference to either FIG. 1 or FIG. 21. First of all, we describe the schematic configuration of MEMS switching elements manufactured with a method of manufacturing according to the present embodiment. We will later describe details of the characteristic configuration of the MEMS switching element according to the present invention.

Figure 2:
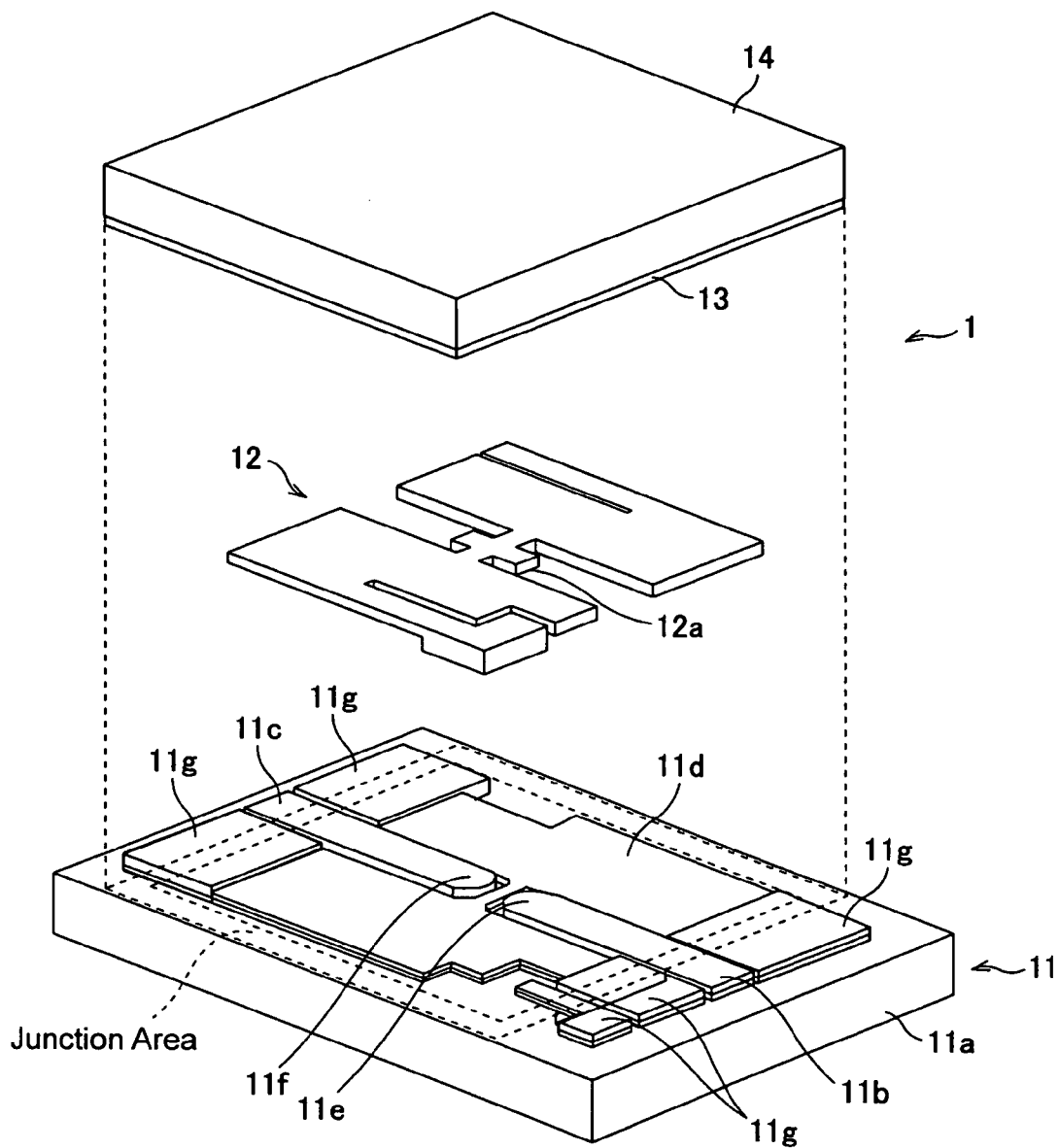
FIG. 2 is an exploded view of a MEMS switching element according to the present embodiment.

As shown in FIG. 2, a MEMS switching element (circuit element) 1 comprises a wiring board 11, a movable electrode (connection) 12, fritted glass (binder/sealed glass) 13, and a cap (lid) 14.

In addition, the wiring board 11 comprises a glass substrate 11a, signal lines (wires) 11b, 11c, a fixed electrode (GND) 11d, fixed contacts 11e, 11f, and bonding pads (wire/earthing conductor) 11g . . . The signal lines 11b, 11c, the fixed electrode 11d, the fixed contacts 11e, 11f, and the bonding pads 11g . . . are formed on the glass substrate 11a.

The movable electrode 12 comprises a movable contact 12a. The movable electrode 12 is also biased toward the cap 14 by a spring (not shown). In addition, the movable electrode 12 is made from a silicon substrate.

Similar to the MEMS switching element 90 shown in the prior art, in the MEMS switching element 1, application of voltage between the fixed electrode 11d and the movable electrode 12 electrically connects the signal line 11b and the signal line 11c, and stopping the application of said voltage releases (opens) said connection.

In the same figure, an area on the wiring board 11 designated as a junction area is the area that comes into contact with the fritted glass 13. In addition, spots of the signal lines 11b, 11c and the bonding pad 11f . . . associated with the junction area correspond to the junction area according to the claims. In other words, the spots of the signal lines 11b, 11c and the bonding pads 11f . . . containing the signal lines 11b, 11c and the surface (including sides) of the bonding pad 11f . . . that will be said junction area correspond to said spot of junction.

Now, we describe a method of manufacturing the above MEMS switching element 1 based on the following (1) to (5). The MEMS switching element 1 is manufactured by using the wafer level packaging technology. The benefits in using the technology is that processing for respective elements in each production process will be free from fluctuations because a plurality of elements are collectively manufactured. Thus, quality can be easily stabilized compared with the case in which elements are individually manufactured. In addition, when the same number of elements are manufactured, the total number of processes can be smaller than the case in which elements are individually manufactured.

(1) Production of a Glass Cap Substrate having a Plurality of Caps 14

Figure 3A:
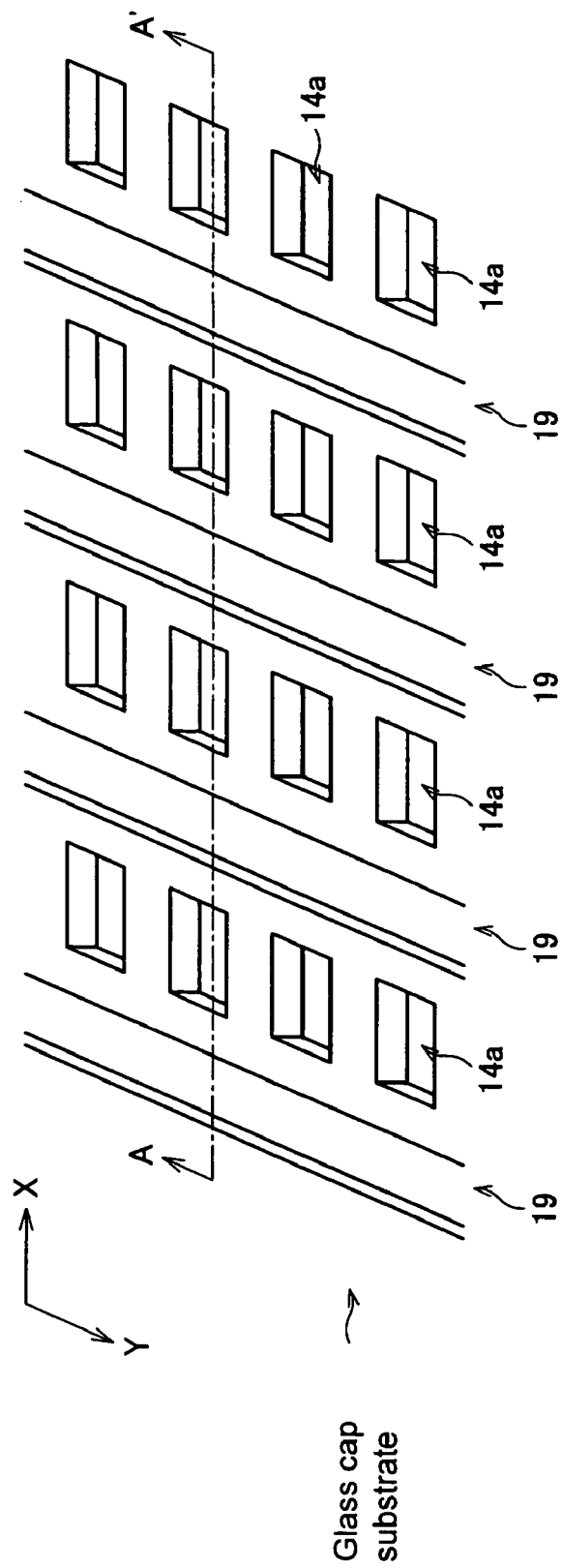
FIG. 3A is a perspective view of a glass cap substrate.
Figure 3B:
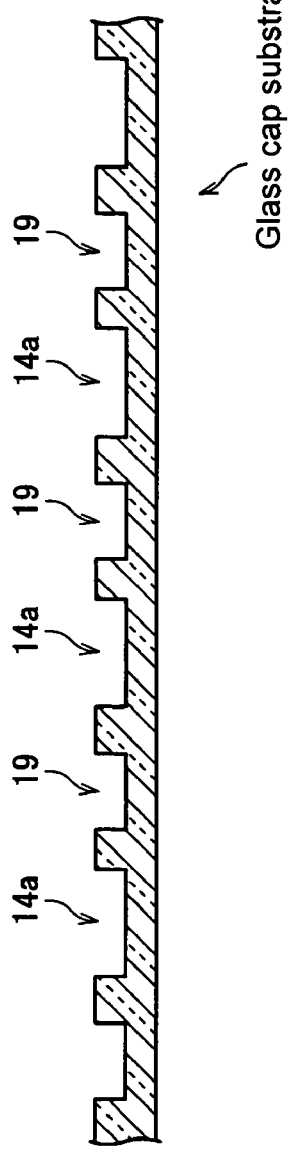
FIG. 3B shows a cross-sectional view along the line AA' of FIG. 3A.

First, as shown in FIG. 3A, B and FIG. 4A, cavities 14a . . . are formed at predetermined positions on glass wafer by etching. Then, channels 19 are formed on predetermined positions on the glass wafer by etching.

Now the cavities 14a . . . are formed at given intervals in X direction and Y directions of FIG. 3A, respectively. In other words, the cavities 14a . . . are formed like a matrix. The channels 19 are also formed at given intervals in X direction of the same figure so as to sandwich the cavities 14a . . . In addition, each cavity 14a should be shaped having depth so that the movable contact 12a of the movable electrode 12 can guarantee noncontact condition with the fixed contacts 11e, 11c. In addition, the surface perpendicular to the depth direction (aperture plane) in each cavity 14a is shaped having the size that can accommodate the movable electrode 12.

As described above, the glass cap substrate having the plurality of caps 14 is formed.

(2) Generation of the Fritted Glass 13

Figure 5:
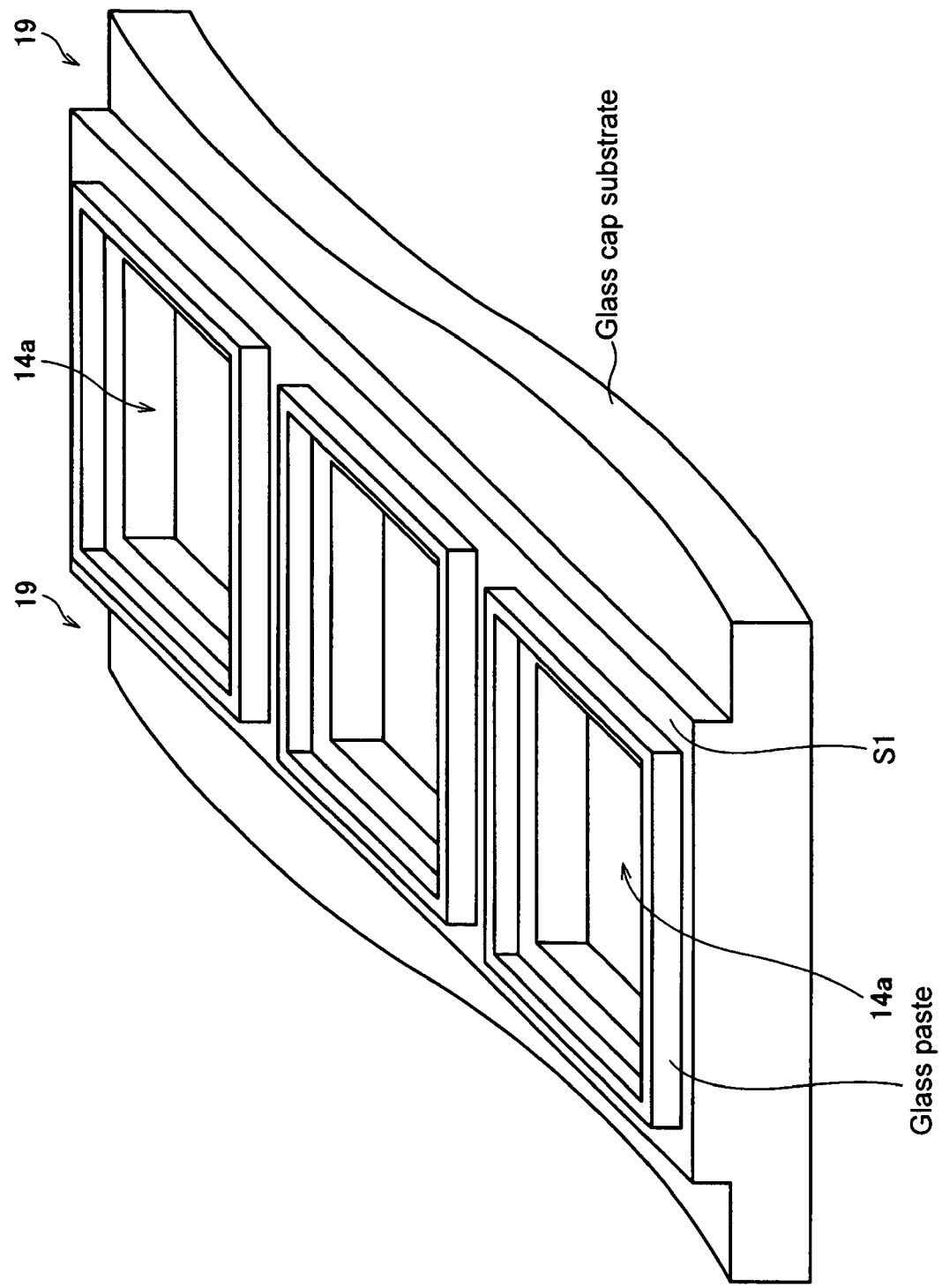
FIG. 5 is a perspective view of a glass cap substrate with glass paste, after the glass paste is applied to a surface of the glass cap substrate.

As shown in FIG. 5 and FIG. 4B, glass paste which is a mixture of sealed glass powder and binder containing organic substances (hereinafter referred to as organic binder) is printed on a surface S1 (hereinafter referred to as an opposed surface S1) that is opposed to the wiring board 11, and excludes the bottom of the cavities 14a and that of the channels 19, so that it surrounds the periphery of the respective cavities 14a, and at predetermined positions. The predetermined positions herein refer to the positions corresponding to the junction area shown in FIG. 2.

Printing of said glass paste takes place the periphery of the plurality of the cavities 14a at one time by using a screen mask and a printer (i.e., by screen printing). The screen printing is done because it enables microfabrication of line width being 100 μm or less, and printing can take place on a wafer.

Then, in order to evaporate organic binder contained in said glass paste and sinter sealed glass powder, the glass cap substrate on which the glass paste is printed is baked in oven (FIG. 4C). What is left after the organic binder is evaporated corresponds to fritted glass.

With the above, the fritted glass 13 is generated in the glass cap substrate (3) Production of a Fixed Substrate Comprised of a Plurality of Wiring Boards 11

Figure 6:
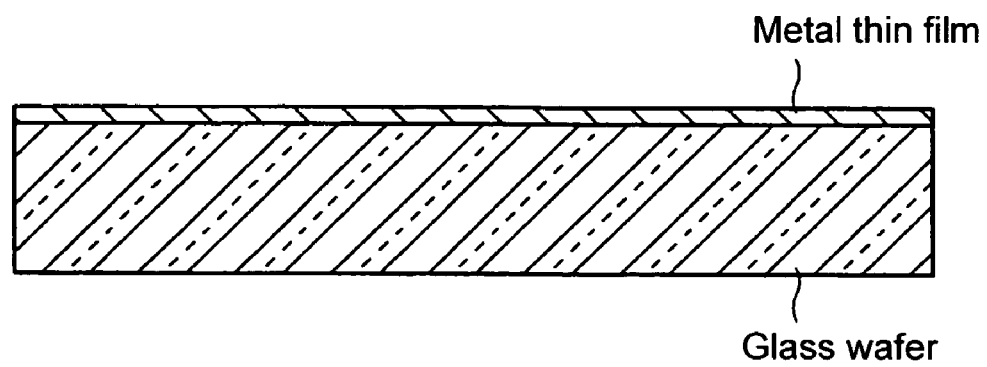
FIG. 6 is a cross-sectional view of a fixed substrate after a metal thin film is formed on glass wafer.

First, the above glass wafer refers to another glass wafer on which, as shown in FIG. 6, a metal thin film for the signal lines 11b, 11c, the fixed electrode 11d, and the bonding pads 11g . . . is formed. Then, a resist pattern is generated on the metal thin film, by using a photomask on which a predetermined pattern is formed.

Now, we describe a photomask pattern. As shown in FIG. 1, for the pattern of the photomask 20, in the area corresponding to said junction area (Area A surrounded by 2 dotted rectangles in the same figure), both flanks La, Lb of the pattern for forming the signal lines 11b, 11c (hereinafter referred to as a signal line pattern) and both flanks Lc, Ld of the pattern for forming the bonding pads 11g . . . (hereinafter referred to as a bonding pad pattern) are bent.

More specifically, in said Area A, the photomask 20 comprises the signal line pattern having a depression 21 and a depression 22, respectively, on both flanks of the pattern, and the bonding pad pattern having a depression 23 and a depression 24, respectively on both flanks of the pattern. In addition, in the same figure, the depressions 21 to 24 have the shape of U shape.

Figure 1:
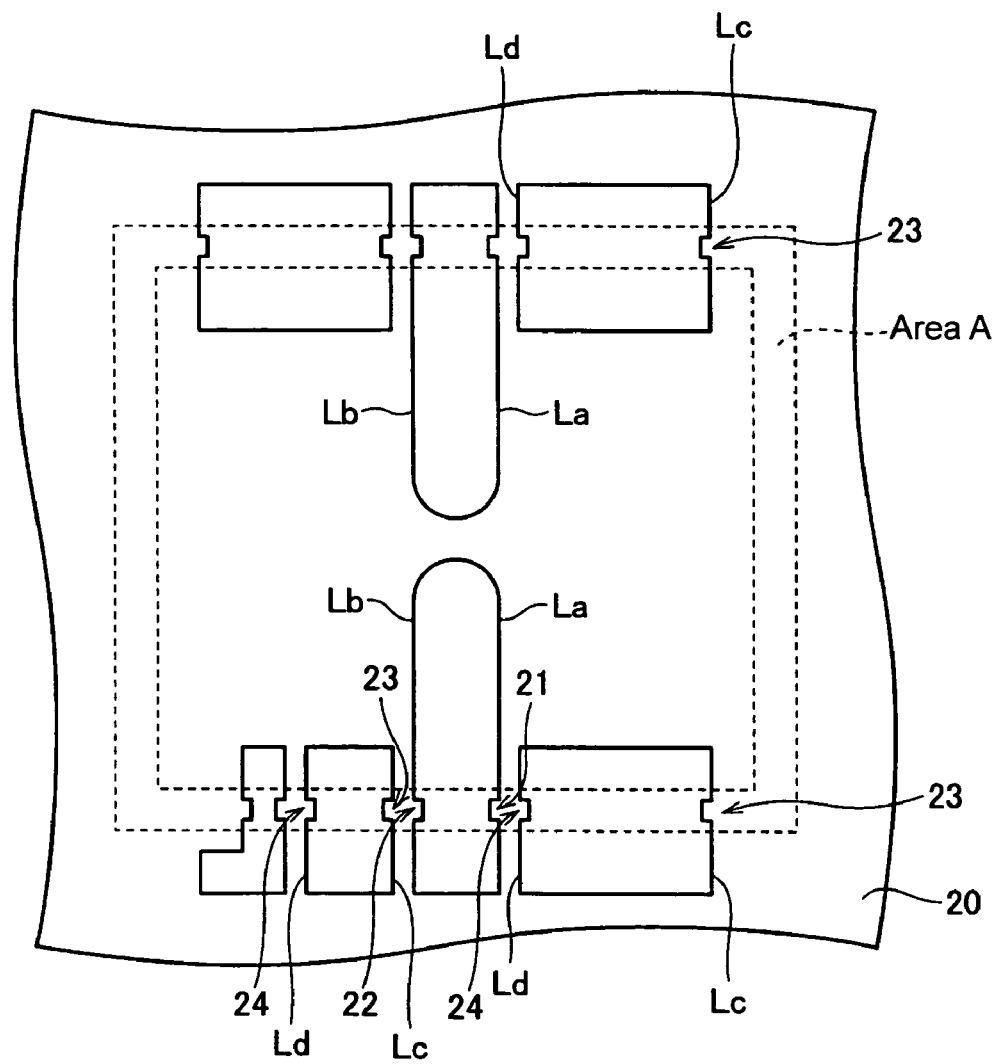
FIG. 1 is a top view of a part of a photomask according to the present embodiment.

Although FIG. 1 shows the only pattern corresponding to one wiring board 11 for convenience of explanation, more than one pattern shown in the same figure is formed on the photomask.

Figure 7A:
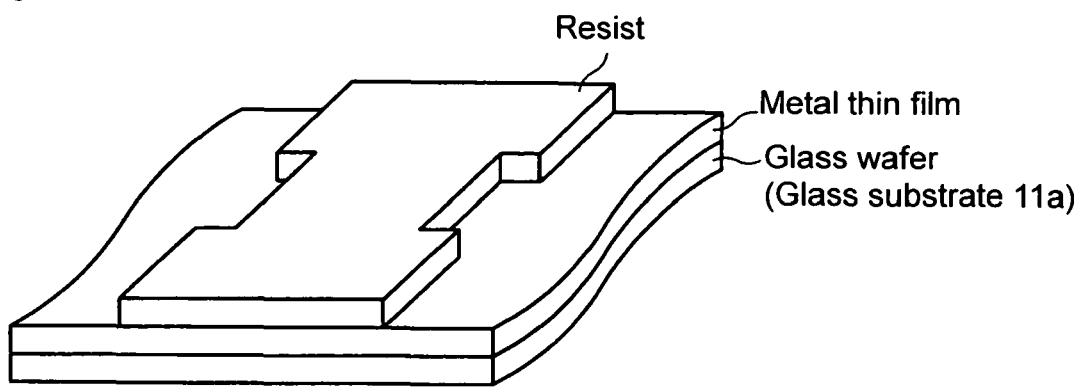
FIG. 7A to FIG. 7C show perspective views of one example of a manufacturing process of said fixed substrate.

When a resist pattern is generated by using such the photomask 20, a resist pattern according to the signal line pattern (or the bonding pad pattern), as shown in FIG. 7A, is formed in said junction area on the metal thin film. In the following, for convenience of explanation, we focus on the signal line 11b. However, the signal line 11c, and the bonding pad 11g . . . are also similar to the signal line 11b.

Figure 7B:
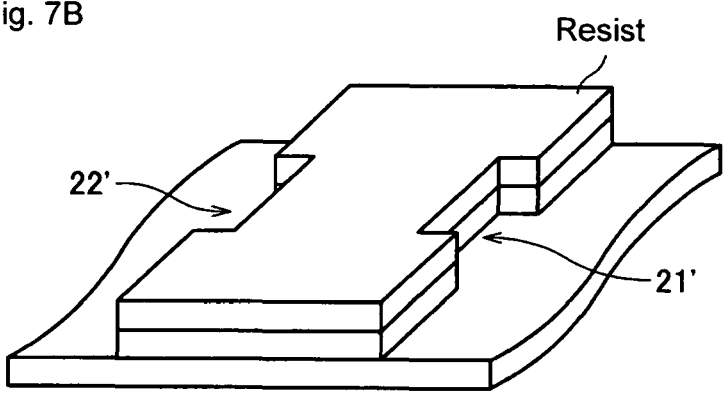
Figure 7C:
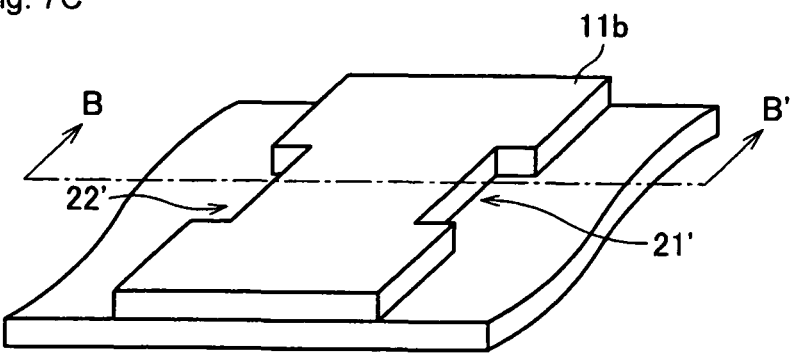
Figure 8:
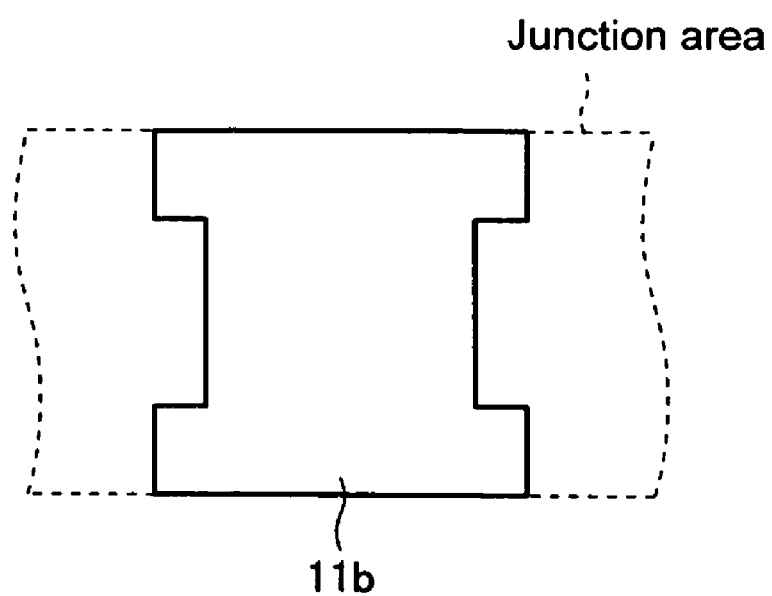
FIG. 8 is a top view of a signal line in a junction area joined by fritted glass.

After said resist pattern is formed, as shown in FIG. 7B, the metal thin film is etched by wet etching. Then, after said etching finishes, the resist is removed, as shown in FIG. 7C and FIG. 8.

Incidentally, during said etching, accumulation of etchant being used in etching occurs at spots corresponding to the depression 21 and the depression 22, thus slowing down the etching rate. In other words, the etching rate at the spots corresponding to with the depression 21 and the depression 22 is slower than that at the spots corresponding to linear flanks on both sides of the depression 21 and the depression 22.

Figure 9:
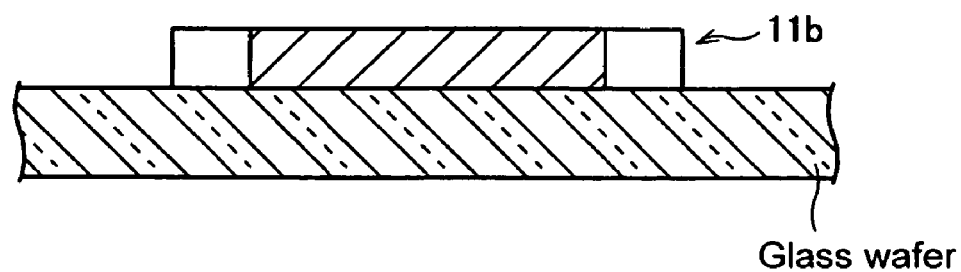
FIG. 9 is a cross-sectional view of the line BB' of FIG. 7C.

Thus, irrespective of a position in the fixed substrate, inclination (sagging) of the resist as before no longer occurs in the parts corresponding to the depression 21 and the depression 22. Consequently, it becomes possible to prevent the signal line 11b from having inverted-mesa structure, as shown in FIG. 9, in the depression (bend) 21' and the depression (bend) 22' of the signal line 11b that are formed corresponding to the depression 21 and the depression 22.

As described above, the fixed substrate comprised of a plurality of the wiring boards 11 is manufactured.

Figure 10:
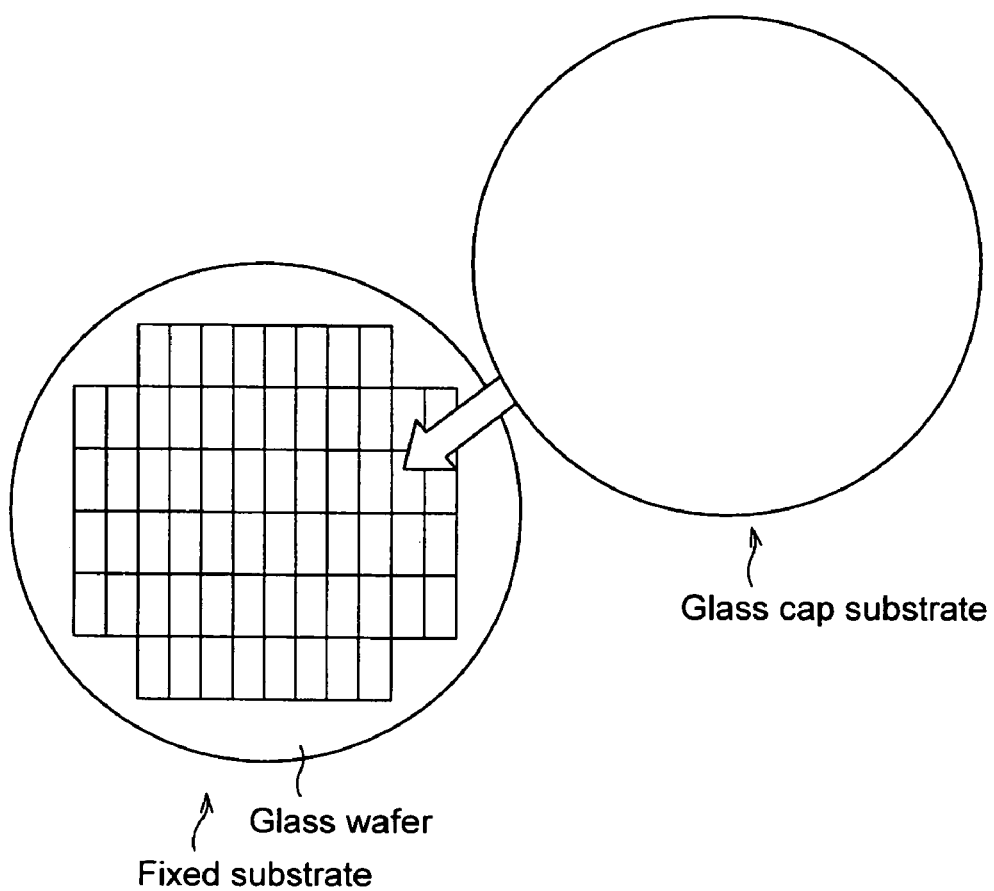
FIG. 10 is a view for illustrating joining of the fixed substrate with the glass cap substrate.
Figure 11:
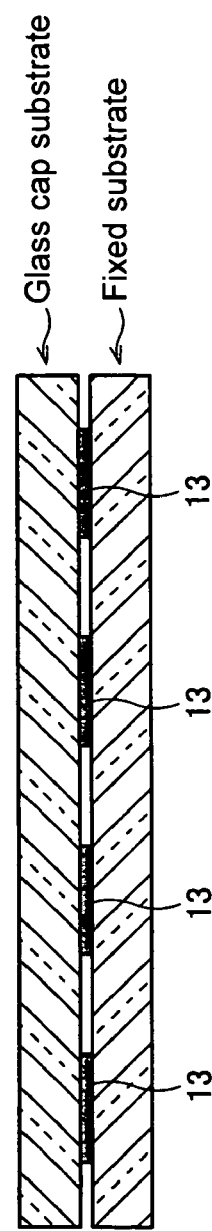
FIG. 11 is a cross-sectional view of a group of MEMS switching elements.

(4) Joining of a Glass Cap Substrate on which the Fritted Glass 13 is Printed and the Fixed Substrate The glass cap on which the fritted glass 13 is printed and the fixed substrate are joined, as shown in FIG. 10 and FIG. 11, by heating the glass cap on which the fritted glass 13 is printed to approximately 400° C., and then applying load of about 500 kgf between the glass cap and the fixed substrate. More specifically, as shown in FIG. 4D, after the respective movable electrodes 12 are generated at predetermined positions on the respective wiring boards 11, under reduced pressure, the above glass cap substrate is joined to the fixed substrate, as shown in FIG. 4E, so that the respective caps 14 cover the respective movable electrodes 12. Then, viscosity of the fritted glass 13 at the time of joining is approximately 1000 (Pa·s).

(5) Dicing

Figure 12:
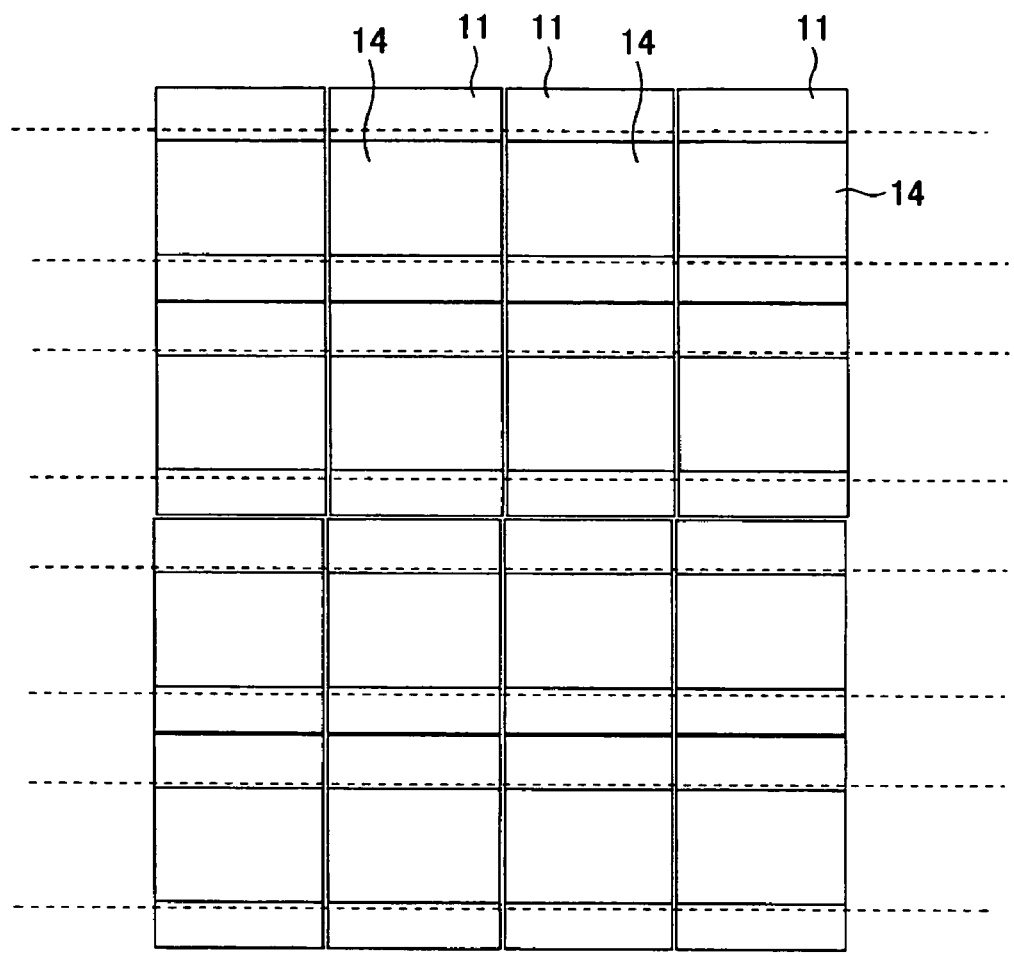
FIG. 12 is a top view of the respective MEMS switching elements after they are made into discrete chips by said dicing.

After said glass cap substrate and the fixed substrate are joined, the fixed substrate to which the glass cap substrate is joined is cut together with said glass cap substrate, into discrete chips (MEMS switching elements 1), as shown in FIG. 12 and FIG. 4F. In addition, the dash line of FIG. 12 shows sections where only the glass cap substrate should be cut.

As described above, a plurality of MEMS switching elements 1 are manufactured at one time after going through the processes in (1) to (5) above.

Figure 13:
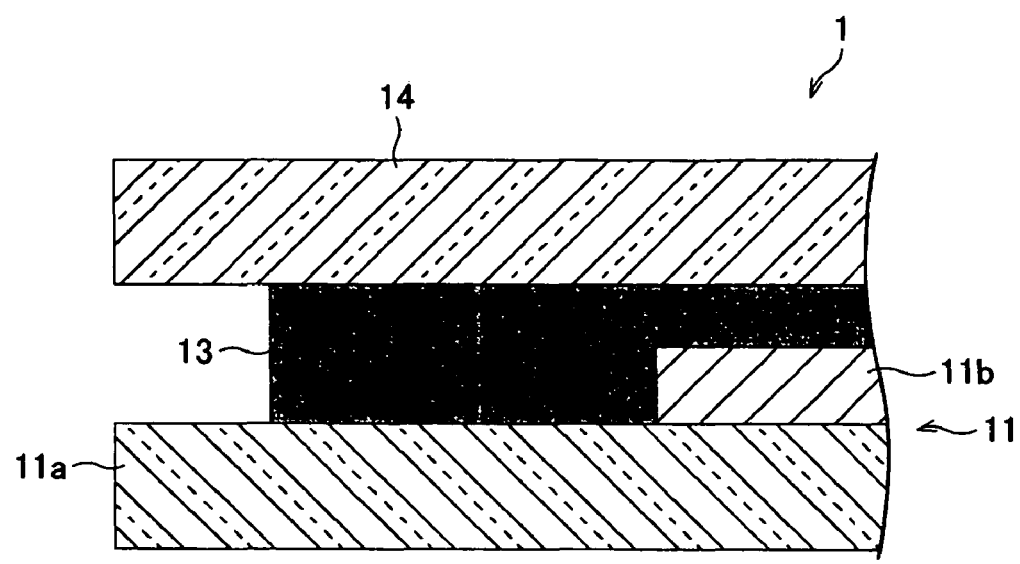
FIG. 13 is a partial sectional view of a MEMS switching element, showing a section perpendicular to the direction of extended signal line.

The signal line 1b of the MEMS switching elements 1 manufactured with such the method does not have inverted-mesa structure in the depression 21' and the depression 22'. Therefore, in the depression 21' and the depression 22' (more specifically, step-like parts resulting from generation of the signal line 11b in the glass substrate 11a in the depression 21' and the depression 22'), the fritted glass 13 can be poured without creating a gap in the respective depressions. In other words, a shutoff area of a leak path (gas leak route) can be formed without fail, as shown in FIG. 13.

In addition, this is not limited to the signal line 11b, and similarly in the signal line 11c and the bonding pads 11g . . . , the fritted glass 13 can be poured without creating a gap in the respective depressions.

Thus, the space above the surface area containing the movable electrode 12, and at least a part of the signal lines 11b, 11c can be perfectly sealed by the cap 14 and the fritted glass 13.

In addition to the benefit that generation of the inverted-mesa structure can be prevented, there are at least 2 other benefits from use of the above photomask 20.

Figure 14:
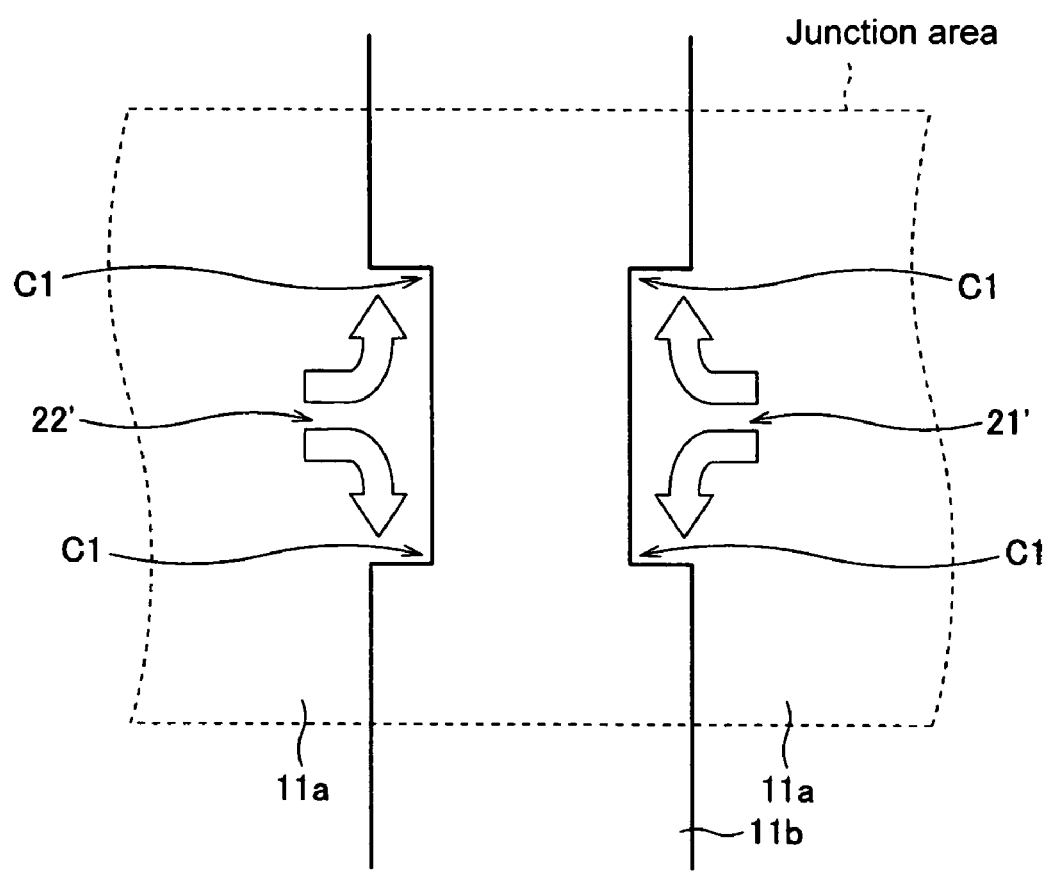
FIG. 14 is a view for illustrating flow of fritted glass into a depression of the signal line.

First, one benefit is that adoption of the configuration wherein the above flanks are bent can make a difference in the degree of filling in the fritted glass 13. To be specific, as shown in FIG. 14, the fritted glass 13 is preferentially filled into the corner C1 of the depression 21' and the depression 22'. Thus, the movable electrode 12 and the above space could be sealed more reliably at the corner C1, thereby improving reliability.

In addition, conductance C that represents easiness of leak is shown in the following expression (1):

$$C = 1.21 \times 10^2 \times (DL3/LL) \qquad (1)$$

However DL is a diameter of the area where a leak hole is formed, and LL shows length of a path in which the leak hole is formed. Now, as shown in the above expression (1), if it is assumed that DL is constant, the conductance may be in inversely proportional to LL.

Thus, as a second benefit, the possibility of the leak path being generated could be lowered by extending the path of the above flank that can be a leak path, thereby improving reliability in sealing.

Figure 15:
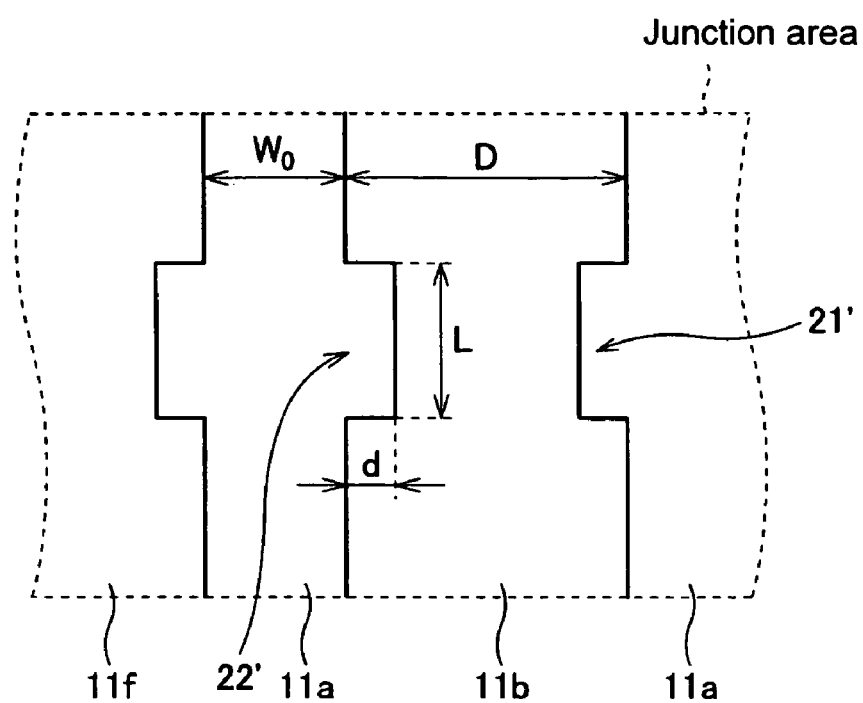
FIG. 15 is a top view of a part of a wiring board that is a component of said MEMS switching element.

In order to prevent occurrence of the inverted-mesa structure more effectively, with respect to the respective depressions in the signal lines 11b, 11c and the bonding pad 11g .. ., as shown in FIG. 15, it is necessary to make the length (hereinafter referred to as depth d) of the side perpendicular to the flank direction be a certain degree of length (proportionate) to the length of the flank (hereinafter referred to as width L). To be specific, experiments confirmed that the relationship of the following expression (2) should be satisfied.

$$d > L/4 \quad (2)$$

In addition, although the MEMS switching element 1 is used as an element for high frequency, consideration should be given to characteristic impedance matching of the signal lines 11b, 11c with the bonding pad 11g connected to the fixed electrode (GND) 11d, if the element 1 is configured to be of coplanar type.

In other words, setting to too a high value the depth d of the depression 21' and the depression 22' of the signal lines 11b, 11c results in a mismatch between a spot where the depressions 21', 22' are not formed and the characteristic impedance, thereby increasing transmission loss of signals passing through the signal lines 11b, 11c.

In general, there is a relationship of the following expressions (3) and (4) between the characteristic impedance and voltage standing wave ratio (VSWR) representing transmission loss of the above signals.

$$VSWR = Z1/Z0 (Z1 > Z0) \quad (3)$$

$$VSWR = Z0/Z1 (Z0 > Z1) \quad (4)$$

However, Z0 represents the characteristic impedance with the bonding pad 11g connected to the fixed electrode 11d, of the signal lines 11b, 11c in the spot where the depression 21' and the depression 22' are not formed, and Z1 represents the characteristic impedance with the bonding pad 11g connected to the fixed electrode 11d, of the signal lines 11b, 11c in the spot where the depression 21' and the depression 22' are formed.

Thus, a relationship of the following expression (5) is established from the expressions (3) and (4).

$$Z0 \times VSWR < Z1 < Z0/VSWR \quad (5)$$

where Z1 should satisfy a relationship of the following expression (6) if designing takes place assuming that VSRW is 1.25 or lower and Z0 is 50Ω.

$$40 < Z1 < 62.5 \quad (6)$$

On the one hand, the characteristic impedance Z1 is expressed by the following expression (7):

[Mathematical expression 1]

$$Z_1 = \frac{\eta_0}{2.0\sqrt{\varepsilon_{eff}}} \frac{1.0}{\frac{1.0}{2.0}\pi \ln\left(2.0 \frac{\sqrt{1.0+k} + \sqrt[4]{4.0k}}{\sqrt{1.0+k} - \sqrt[4]{4.0k}}\right) + \frac{1.0}{2.0}\pi \ln\left(2.0 \frac{\sqrt{1.0+k_1} + \sqrt[4]{4.0k_1}}{\sqrt{1.0+k_1} - \sqrt[4]{4.0k_1}}\right)} \quad (7)$$

However, $\eta 0 = \mu 0/\epsilon 0$, and $\mu 0$ is magnetic permeability in a vacuum, and $\epsilon 0$ is dielectric constant in a vacuum. In addition, $\epsilon_{eff}$ is effective dielectric constant. In addition, k and k1 are expressed in the following expressions (8) and (9), respectively.

[Mathematical expression 2]

$$k = \frac{D - 2d}{D + 2d + 2W_0} \quad (8)$$

[Mathematical expression 3]

$$k_1 = \frac{\tanh\left(\frac{\pi(D-2d)}{4.0h}\right)}{\tanh\left(\frac{\pi(D+2d+2W_0)}{4.0h}\right)} \quad (9)$$

However, h is thickness of a glass substrate 11a and W0 is a distance between the above-mentioned linear flank and the fixed electrode 11d In addition, as shown in FIG. 15, D represents width of the signal lines 11b, 11c in the spot where the depression 21' and the depression 22' are not formed.

Now, if we determine from the expression (7) the depth d in a range that satisfies the condition of the above expression (6), the following expression (10) will be obtained:

[Mathematical expression 4]

$$\frac{D - 18W_0}{20} < d < \frac{D - 3W_0}{8} \quad (10)$$

Thus, if a value of d is set to fall within the range that satisfies the above expression (10), and Z0 is 50Ω, VSWR can be 1.25 or lower.

If it is aimed to improve reliability in sealing, rather than having a lower value of VSRW, there is no need to set the depth d so that it satisfies the above expression (10). The depth d may be set simply to satisfy the relationship of the above expression (2).

Figure 16:
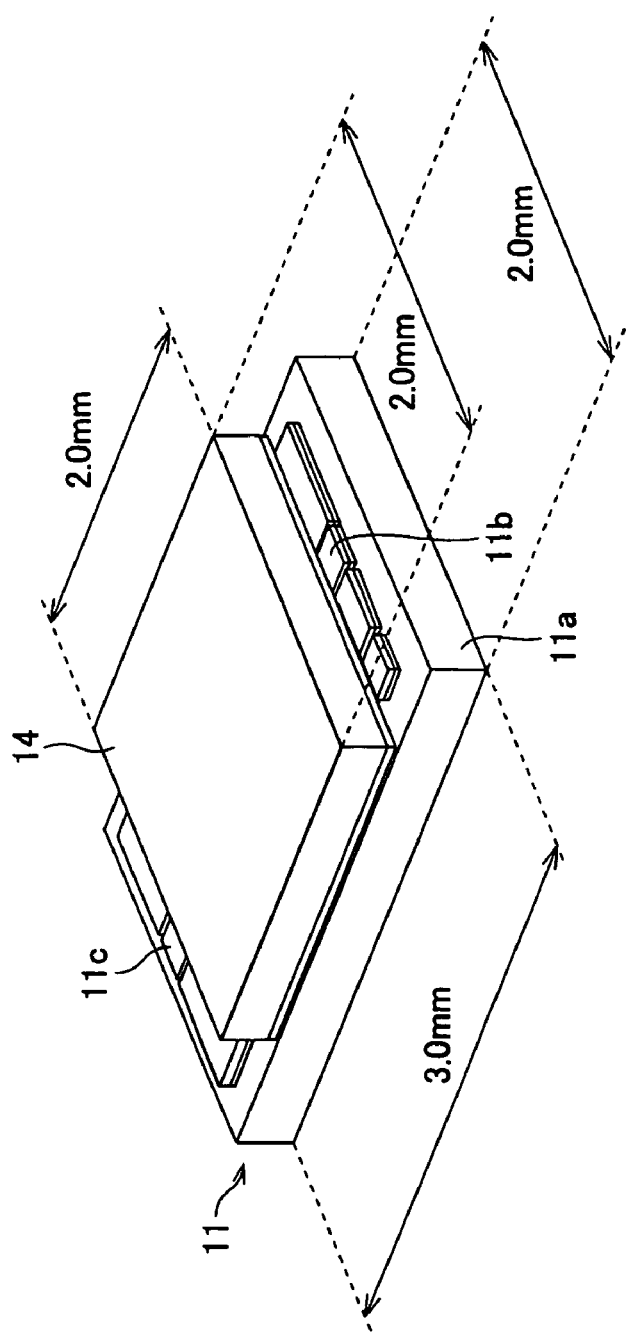
FIG. 16 is a perspective view of the MEMS switching element that is formed in predetermined size.

Now, indeed, the MEMS switching element 1 was manufactured. Then, with the above mask pattern, and as shown in FIG. 16, not only the length in the extended direction of the signal line and that in the direction perpendicular to the extended direction with respect to the wiring board 11 were set to 3.0 mm and 2.0 mm, respectively, but also the top face of the cap 14 (the surface opposed to the opening of the cavity 14a) was sized to be 2.0 mm×2.0 mm. In addition, the above width L and the above depth d of the depressions in the signal lines 11b, 11c and the bonding pad 11g ... were set to 15 μm and 5 μm, respectively. Furthermore, the width of the fritted glass 13 (Wf in FIG. 5) was set to 280 μm. In addition, in the respective bonding pads 11g, if the length of the signal lines 11b, 11c in the extended direction and the vertical direction were made to be the width of the bonding pads 11g ..., the width in the widest bonding pad 11g would be 500 μm.

Then, the rate of incidence of poor sealing was 0% with the MEMS switching element 1 provided with the depressions, whereas the rate had even reached 90% with the conventional configuration having no depression described above. Hence, provision of the depressions could prevent occurrence of poor sealing.

Although in the above, the MEMS switching element 1 was manufactured by using the photomask 20 as shown in FIG. 1, shape of the photomask pattern shall not be limited to the shape described above.

Figure 17:
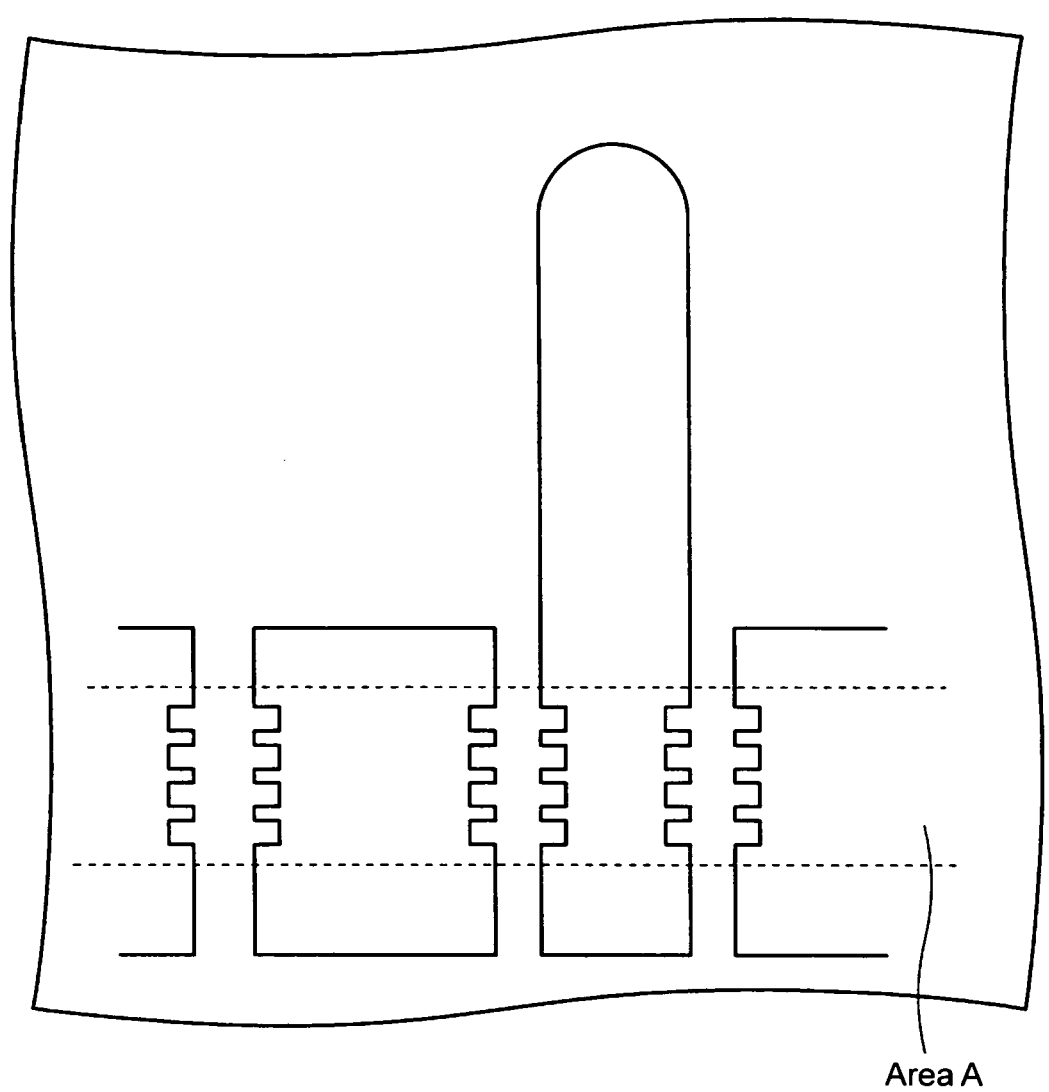
FIG. 17 is a top view of a part of other photomask according to the embodiment of the present invention.
Figure 18:
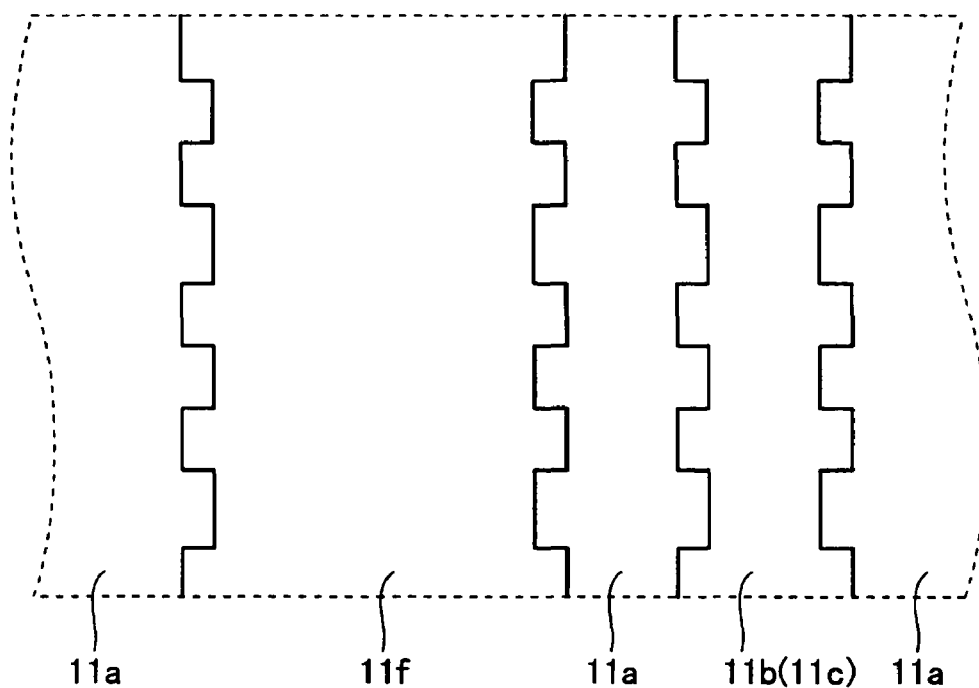
FIG. 18 is a top view of a part of a wiring board that has been formed by using said other photomask.

For instance, as shown in FIG. 17, the configuration may be such that in the above-mentioned Area A, the signal line patterns have a plurality of depressions 21 and a plurality of depressions 22 on both flanks of the pattern and the bonding pad patterns have a plurality of depressions 23 and a plurality of depressions 24 on both flanks of the pattern. Now, if the pattern as described above were used, the signal lines 11b, 11c and the bonding pads 11g . . . having the shape as shown in FIG. 18 could be obtained. In addition, the number of the respective depressions shall not be limited and may be set as appropriate.

Then, the degree of filling of the fritted glass 13 may vary in a number of spots, by thus increasing the number of the depressions. It is also possible to further extend the path in the above flanks that can be a leak path.

Thus, reliability in sealing can be further enhanced by increasing the number of the depressions, as described above.

Although in the above, the depressions 21, 22 are provided in both flanks of the signal line patterns, the configuration may be such that a depression is provided only on one flank. This could also apply to the bonding pad pattern. In this case, although reliability in sealing is inferior to the configuration in which the depressions are provided on both flanks (i.e., the chance of leak occurrence will rise), the above reliability can be better than the conventional configuration.

Figure 19C:
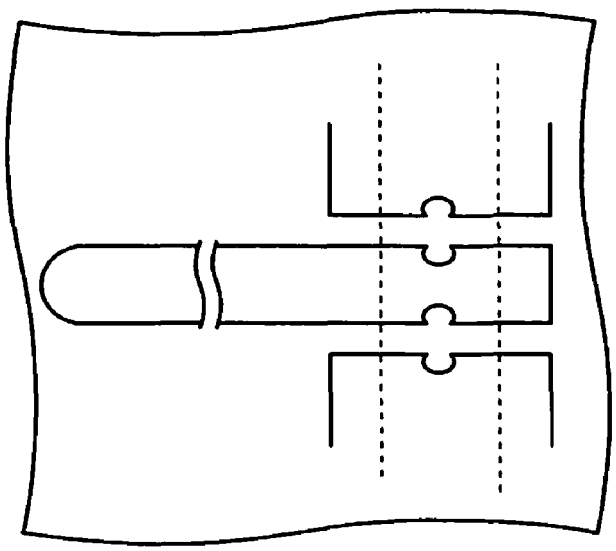
FIG. 19A to FIG. 19C are top views of a part of the photomask according to still other embodiment, respectively.
Figure 19B:
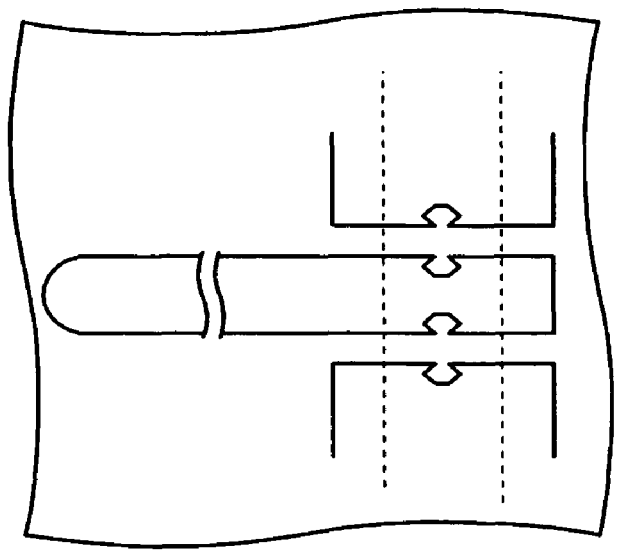
Figure 19A:
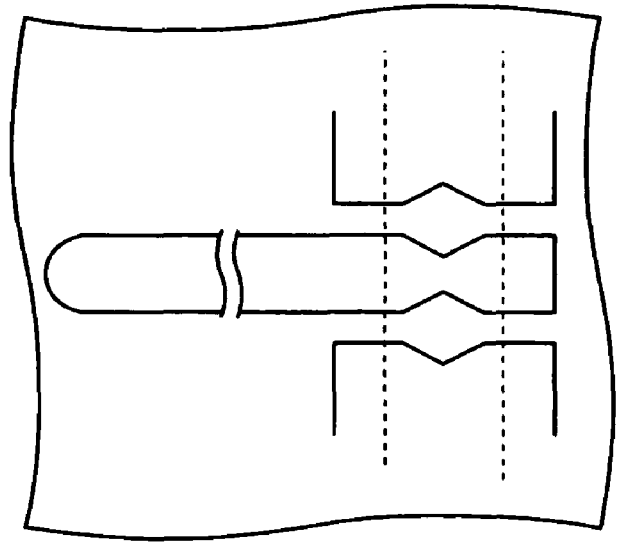

Although in the above embodiment, a shape of a concave part in each depression of the above pattern was rectangular, as shown in FIG. 1, it shall not be limited to this. For instance, it may be polygonal, as it is triangular as shown in FIG. 19A or hexagonal as shown in FIG. 19B. Otherwise, as shown in FIG. 19C, the shape may be one of a circle divided into 2 semicircles. The flanks of the above signal line patterns and of the bonding pad patterns may simply end in the above Area A.

In addition, if a plurality of concave parts are provided (the number of depressions is increased), the various shapes as mentioned above may be combined. A pattern comprised of a repetition of forms that are bent to a predetermined shape may also be used.

If the pattern is changed as described above, it is needless to say that the signal lines 11b, 11c and the bonding pads 11g . . . in accordance with the changed pattern will be formed.

Figure 20:
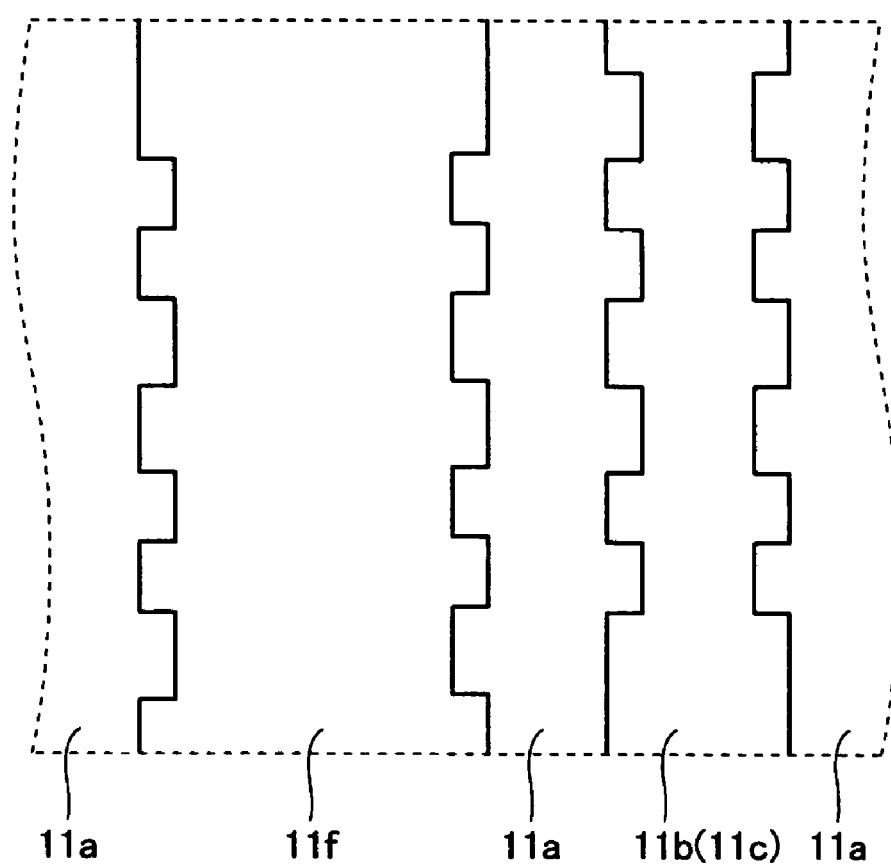
FIG. 20 is a top view of a part of a wiring board by using still other photomask.

In addition, as shown in FIG. 20, preferably, the depressions of the bonding pad 11g which is connected to fixed electrode 11d and those of the signal lines 11b, 11c are not opposed face to face, and instead are offset from each other. Such the configuration could increase a value of the depth d while keeping the above VSWR lower than a predetermined value, compared with the case in which positions of the both are not mutually offset as described above. Thus, a path on the above flanks that can be a leak path may be longer than the case in which the above positions are not offset. Therefore, reliability in sealing can be further enhanced.

Although in the above we described by way of the MEMS switching element (relay), the present invention shall not be limited to this. It may also apply to such an element as a switch, a filter, a resonator, a phase shifter, etc. and even circuits equipped with these elements.

In the following, we describe a handheld terminal using the above switch (electrostatic microswitch). As shown in FIG. 21, in the handheld terminal (communications device) 61, 2 switches (selection unit) 62a, 62b are employed. One switch 62a serves to switch between an internal antenna 63 and an external antenna 64, while the other switch 62b can switch signal flow to an power amplifier 65 on the side of a transmitting circuit and to a low noise amplifier 66 on the side of a receiving circuit. Thus, the invention can achieve the advantageous effect that a communications device comprising at least a circuit element being reliable in sealing can be provided.

As described above, in a manufacturing method of the above-mentioned wiring board 11, wherein the wiring board 11 has wiring (the signal lines 11b, 11c and the bonding pad 11g) formed on the glass substrate 11a, and the space above the surface area containing at least a part of said wiring is subject to sealing by the glass cap (lid) 14 and the fritted glass (binder) 13 for joining the glass cap 14, the glass substrate 11a and said wiring, the method comprises a first step of forming a metal thin film for wiring on the glass substrate 11a, a second step of generating a resist pattern on said metal thin film by using a photomask 20 on which a wiring pattern is formed, and a third step of selectively removing the metal thin film by wet etching with said resist pattern as a mask and forming said wiring, wherein if it is assumed that a spot of the wiring to be joined by the fritted glass 13 is a spot of junction, flanks (La, Lb, Lc, Ld) of said wiring pattern bend in the area corresponding to said spot of junction.

With this method, the first step enables the metal thin film to be formed on the glass substrate 11a. In addition, the second step enables a resist pattern to be generated on the metal thin film by using the photomask 20 on which the wiring pattern is formed.

Now, as the flanks (La, Lb, Lc, Ld) of said wiring pattern bend in the area corresponding to said spot of junction, the generated resist pattern also bends in the spot corresponding to said area (in other words, the spot corresponding to the spot of junction).

Furthermore, with the third step, it is also possible to selectively remove the metal thin film by wet etching with the resist pattern bent in the spot corresponding to said area as a mask and form wiring.

Hence, as described above, etchant to be used in wet etching accumulates in the spot where said resist pattern is bent. In other words, the etching speed in said bent spot is slower than in the spot that is not bent.

Thus, occurrence of side etching can be controlled in said spot that is bent, even though side etching occurs in said spot that is not bent. Consequently, for the wiring in said bent spot, generation of inverted-mesa structure (i.e., structure in which width of wire becomes narrow as it comes close to the substrate) resulting from the resist sagging to the side of the glass substrate 11a can be controlled.

Therefore, when the space above the surface area contacting at least a part of said wiring is sealed by the glass cap 14 and the fritted glass 13, the fritted glass 13 can be completely poured into a step-like section that resulted when the wiring is formed on the glass substrate 11a.

Thus, if the method of manufacturing according to the present embodiment is used, the wiring board 11 that can reliably seal the space above the surface area mentioned above can be manufactured.

In addition, the photomask 20 is used in the manufacture of the wiring board having the wiring formed on the glass substrate 11a, and the wiring board 11a being subject to sealing by the glass cap 14 and the fritted glass 13 for joining the glass cap 14, the glass substrate 11a and said wiring, wherein if it is assumed that a wiring pattern is formed and a spot of the wiring to be joined by the fritted glass 13 is a spot of junction, the photomask 20 is such configured that the flanks for said wiring pattern bend in the area corresponding to said spot of junction.

With this configuration, as the flanks for said wiring patterns bend in the area corresponding to said spot of junction, the resist pattern to be generated by masking with the photomask 20 will also bend in the spot corresponding to said area.

Thus, in the sot where said resist pattern is bent, if wet etching takes place on a thin film (metal thin film) that will be wiring, accumulation of etchant to be used in etching occurs. In other words, the etching speed in said bent spot is slower than that in the spot that is not bent.

Thus, occurrence of side etching can be controlled in said spot that is bent, even though side etching occurs in said spot that is not bent. Consequently, for the wiring in said bent spot, generation of inverted-mesa structure (i.e., structure in which width of wire becomes narrow as it comes close to the substrate) resulting from the resist sagging to the side of the glass substrate 11a can be controlled.

Therefore, when the space above the surface area contacting at least a part of said wiring is sealed by the glass cap 14 and the fritted glass 13, the fritted glass 13 can be completely poured into a step-like section that resulted when the wiring is formed on the glass substrate 11a.

Therefore, with the photomask 20, the wiring board 11 that can reliably seal the space above the surface area mentioned above can be manufactured.

In addition, in the wiring board 11 having the wiring formed on the glass substrate 11a and the space above the surface area containing at least a part of said wiring is subject to sealing by the glass cap 14 and the fritted glass 13 for joining the glass cap 14, the glass substrate 11a and said wiring, the wiring board 11 may be such configured that if it is assumed that a spot of the wiring to be joined by the fritted glass 13 is a spot of junction, any one flank of the both flanks (La and Lb (or Lc and Ld)) of said wiring comprises a plurality of depressions (bends) n said spot of junction.

According to this configuration, as any one flank of the both flanks of said wiring comprises a plurality of bends in said spot of junction, the respective bends are filled with the fritted glass 13 more preferentially than any spot other than the bends, if the space above said surface area is sealed by the glass cap 14 and the fritted glass 13.

In addition, as the flank comprises said plurality of bends, length of the flan may be longer than the configuration in which only one bend is provided. Thus, it is possible to keep the incidence rate of the event that gas leaks to the external from the upper space along the flank and comprising the bends lower than the configuration in which only one bend is provided.

Therefore, the wiring board 11 will be a wiring board that is highly reliable in sealing of the space above the surface area mentioned above.

In addition, in the wiring board 11 having the wiring formed on the glass substrate 11a and the space above the surface area containing at least a part of said wiring is subject to sealing by the glass cap 14 and the fritted glass 13 for joining the glass cap 14, said substrate, and said wiring, the wiring board 11 may be such configured that if it is assumed that a spot of the wiring to be joined by the fritted glass 13 is a spot of junction, the both flanks (La and Lb (or Lc and Ld)) of said wiring comprise depressions (bends) n said spot of junction.

According to this configuration, the both flanks of said wiring comprise bends in said spot of junction, the respective bends are filled with the fritted glass 13 more preferentially than any spot other than the bends, if the space above said surface area is sealed by the glass cap 14 and the fritted glass 13.

In addition, as the both flanks comprise bends, it is possible to keep the incidence rate of the event that gas leaks from the upper space along the flank to the external lower than the configuration in which the bend is only provided in one flank.

Therefore, the wiring board 11 will be a wiring board that is highly reliable in sealing of the space above the surface area mentioned above.

Although in the above embodiment we described the method of manufacturing the wiring board 11 by using wet etching, the above mentioned wiring board 11 may be manufactured by using dry etching or sand blast processing.

The present invention shall not be limited to the embodiments described above, and various modifications may be added within the scope defined in the claims. In other words, embodiments that can be achieved by combining technical devices that are changed as appropriate within the scope defined in the claim will also fall within the technical scope of the present invention.

What is claimed is:

1. A method of manufacturing a wiring board having wiring formed on a substrate, comprising:
    forming a metal thin film for wiring on the substrate;
    generating a resist pattern on the metal thin film by using a photomask on which a wiring pattern is formed and the resist pattern having at least one depression at a spot junction;
    removing the metal thin film selectively by wet etching with the resist pattern and generating the wiring; and
    joining a lid on the substrate containing a part of the wiring with a binder and making a sealed space above the substrate,
    wherein at the spot of the wiring joined with the lid by the binder is the spot of junction, a flank for the wiring pattern is depressed in the area corresponding to the spot of junction such that the depression of the resist pattern slows a rate of the wet etching of the metal thin film,
    the depression of the resist pattern is shaped like a U shape, and
    a length of the side of the U shape in the direction along the flank is L and a length of the side of the U shape in the direction perpendicular to the flank is d, the following relationship is satisfied:

$d>L/4.$

2. The method of manufacturing the wiring board according to claim 1, wherein both flanks of the wiring pattern are depressed.

3. The method of manufacturing the wiring board according to claim 1, wherein flank depressions are in a plurality of spots.

4. The method of manufacturing the wiring board according to claim 1, wherein
    the wires are comprised of signal lines and earthing conductors; and
    the signal lines and the earthing conductors are spaced at a regular interval; and
    the interval is WO and width of the signal line is D, the following relationship is satisfied:

$(D-18W0)/20<d<(D-3W0)/8.$

* * * * *